(12) United States Patent
Lin et al.

(10) Patent No.: US 12,506,059 B2
(45) Date of Patent: *Dec. 23, 2025

(54) VERTICALLY SPACED INTRA-LEVEL INTERCONNECT LINE METALLIZATION FOR INTEGRATED CIRCUIT DEVICES

(71) Applicant: Intel Corporation, Santa Clara, CA (US)

(72) Inventors: Kevin L. Lin, Beaverton, OR (US); Sukru Yemenicioglu, Santa Clara, CA (US); Patrick Morrow, Portland, OR (US); Richard Schenker, Portland, OR (US); Mauro Kobrinsky, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/622,500

(22) Filed: Mar. 29, 2024

(65) Prior Publication Data

US 2024/0243052 A1 Jul. 18, 2024

Related U.S. Application Data

(63) Continuation of application No. 16/914,132, filed on Jun. 26, 2020, now Pat. No. 11,948,874.

(51) Int. Cl.
*H01L 23/498* (2006.01)
*H01L 21/768* (2006.01)
(Continued)

(52) U.S. Cl.
CPC .. *H01L 23/49827* (2013.01); *H01L 21/76879* (2013.01); *H05K 1/115* (2013.01);
(Continued)

(58) Field of Classification Search
CPC ......... H01L 21/76885; H01L 21/76897; H01L 23/49827; H01L 21/76808;
(Continued)

(56) References Cited

U.S. PATENT DOCUMENTS 9,129,964 B2   9/2015   Coyner et al.
9,373,543 B1 *  6/2016   Mont ................ H01L 21/76816
(Continued)

OTHER PUBLICATIONS

Extended European Search Report from European Patent Application No. 20209421.5 notified May 27, 2021, 9 pgs.
(Continued)

*Primary Examiner* — Jaehwan Oh
(74) *Attorney, Agent, or Firm* — Essential Patents Group, LLP

(57) ABSTRACT

An integrated circuit interconnect level including a lower metallization line vertically spaced from upper metallization lines. Lower metallization lines may be self-aligned to upper metallization lines enabling increased metallization line width without sacrificing line density for a given interconnect level. Combinations of upper and lower metallization lines within an interconnect metallization level may be designed to control intra-layer resistance/capacitance of integrated circuit interconnect. Dielectric material between two adjacent co-planar metallization lines may be recessed or deposited selectively to the metallization lines. Supplemental metallization may then be deposited and planarized. A top surface of the supplemental metallization may either be recessed to form lower metallization lines between upper metallization lines, or planarized with dielectric material to form upper metallization lines between lower metallization lines. Vias to upper and lower metallization line may extend another metallization level.

20 Claims, 27 Drawing Sheets

(51) Int. Cl.
*H05K 1/11* (2006.01)
*H05K 3/00* (2006.01)
*H05K 3/40* (2006.01)
*H10D 84/83* (2025.01)

(52) U.S. Cl.
CPC ......... *H05K 3/0094* (2013.01); *H05K 3/4038* (2013.01); *H10D 84/83* (2025.01)

(58) Field of Classification Search
CPC ......... H01L 21/76831; H01L 21/76834; H01L 21/76883; H01L 21/76879
See application file for complete search history.

(56) References Cited

U.S. PATENT DOCUMENTS

| | | | | |
|---|---|---|---|---|
| 9,607,893 | B1* | 3/2017 | Zhang | H01L 21/0337 |
| 9,786,557 | B1* | 10/2017 | Chi | H01L 21/76802 |
| 2005/0140020 | A1 | 6/2005 | Bae | |
| 2015/0287675 | A1* | 10/2015 | Shaviv | H01L 21/7685 438/618 |
| 2019/0164815 | A1* | 5/2019 | Lin | H01L 23/528 |
| 2020/0090987 | A1* | 3/2020 | Chandhok | H01L 21/76897 |
| 2020/0135912 | A1 | 4/2020 | Tsai et al. | |
| 2021/0407895 | A1 | 12/2021 | Lin et al. | |

OTHER PUBLICATIONS

Notice of Allowance from U.S. Appl. No. 16/914,132 notified Dec. 15, 2023, 9 pgs.
Restriction Requirement from U.S. Appl. No. 16/914,132 notified Aug. 25, 2023, 5 pgs.
Notice of Allowance from European Patent Application No. 20209421.5 notified Sep. 13, 2024, 7 pgs.
Office Action from Taiwanese Patent Application No. 109145737 notified Aug. 26, 2024, 24 pgs.
Notice of Allowance from Taiwanese Patent Application No. 109145737 notified Mar. 7, 2025, 3 pgs.

* cited by examiner

VERTICALLY SPACED INTRA-LEVEL INTERCONNECT LINE METALLIZATION FOR INTEGRATED CIRCUIT DEVICES

CLAIM OF PRIORITY

This application is a continuation of, and claims priority to, U.S. patent application Ser. No. 16/914,132, filed on Jun. 26, 2020 and titled "VERTICALLY SPACED INTRA-LEVEL INTERCONNECT LINE METALLIZATION FOR INTEGRATED CIRCUIT DEVICES," which is incorporated by reference herein in its entirety.

BACKGROUND

Demand for higher performance integrated circuits (ICs) in electronic device applications has motivated increasingly dense transistor architectures. Interconnect parasitics become a greater challenge as the density of interconnect metallization structures keeps pace with transistor density. For example, the resistance-capacitance (RC) delay associated with interconnects of an IC increase with IC density.

Resistance of an interconnect metallization line can be reduced if the cross-sectional area is increased. For a given line thickness, cross-sectional area may be increased by increasing line width. However, increasing line width typically reduces the density of lines within a given interconnect metallization level. Fabrication techniques and interconnect structures including metallization lines that change the relationship between line width and line density so that wider lines can be formed at a without losing as much line density would therefore be commercially advantageous over alternative techniques and structures.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1:
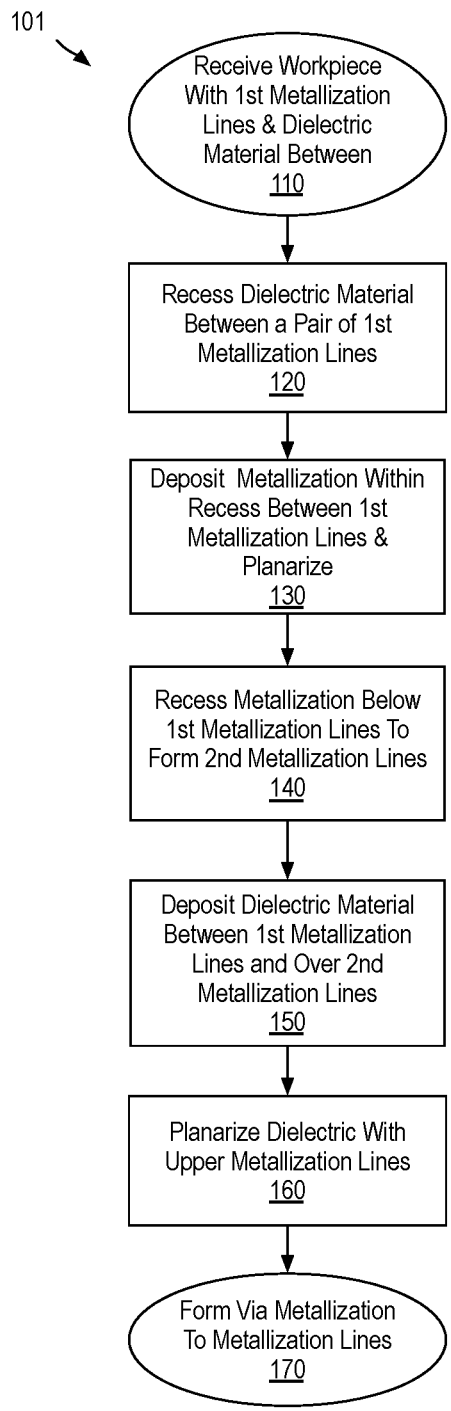
FIG. 1 is a flow chart of methods of vertically spacing intra-level metallization lines, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause and effect relationship).

The terms "over," "under," "between," and "on" as used herein refer to a relative position of one component or material with respect to other components or materials where such physical relationships are noteworthy. For example in the context of materials, one material or layer disposed over or under another may be directly in contact or may have one or more intervening materials or layers. Moreover, one material disposed between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described below are examples of integrated circuit interconnect structures in which a metallization line between two metallization lines is vertically spaced apart within an interconnect line metallization level. For such vertically spaced metallization lines, combinations of upper and lower metallization lines within one interconnect metallization level may be designed to control resistance/capacitance (R/C) of integrated circuit interconnect and/or increase effective line pattern density, or "fill factor." With a vertical separation, or space, between adjacent lines, lower metallization lines may be self-aligned to upper metallization lines, or vice versa, so that a lower metallization line may occupy substantially the entire space between adjacent upper metallization lines. Hence, rather than being spaced laterally some distance from the adjacent metallization lines by an intervening dielectric material, adjacent lines of a given metallization level have vertical separation.

Whereas two different levels of interconnect metallization are independently patterned, both upper and lower lines of a same interconnect metallization level are fabricated from one line pattern. Following the fabrication of one of the upper or lower metallization lines, a self-aligned etch or self-aligned deposition process is employed to fabricate the other of the upper or lower metallization lines. Hence, the upper and lower metallization lines may be referred to herein as "self-aligned" to each other. Although vertically separated, the upper and lower metallization lines are best considered to be lines of a single interconnect level since the routes and dimensions of lower/upper metallization lines are dictated by the routes and dimensions of upper/lower metallization lines. Vertically spaced adjacent upper and lower metallization lines are referred to herein "intra-level" interconnect metallization lines to more clearly distinguish them from metallization lines of two different interconnect levels where one metallization line may be stacked over the another metallization line in any arbitrary manner as a function of two substantially independent wiring level patterns.

As further described below, vertically spaced intra-level metallization lines of a given interconnect metallization level may be routed to a different level of interconnect metallization through via metallization. Because adjacent intra-level lines may have no lateral separation between them, via metallization coupled to a lower intra-level line that passes through the plane of upper intra-level lines (to an overlying interconnect level), and that is to be electrically isolated from the upper-level interconnect lines, is limited to a diameter smaller than a width of the lower intra-level line so that the via is laterally separated from the upper intra-level line. Via metallization coupling a lower intra-level line to an underlying interconnect level is not similarly restricted and may have any diameter (smaller, equal to, or larger than the width of the lower intra-level line). Likewise, the diameter of via metallization coupled to an upper intra-level line that passes through the plane of lower intra-level lines (to an underlying interconnect level) is limited to being smaller than a width of the upper intra-level line while the diameter of via metallization coupling the upper intra-level line to an overlying interconnect level is unrestricted.

Although upper/lower intra-level metallization lines are fabricated so as to permit them to be electrically isolated, they may also be interconnected to each other, as needed. For example, via metallization coupled to an upper intra-level line that passes through the plane of lower intra-level lines (to an underlying interconnect level) that is to be electrically coupled to an adjacent lower intra-level interconnect line may merely have a larger diameter (e.g., at least equal to a width of the upper intra-level line) so that the via metallization has no lateral separation from the lower intra-level line and makes contact with a sidewall of the lower intra-level line. Likewise, via metallization coupled to a lower intra-level line that passes through the plane of upper intra-level lines (to an overlying interconnect level) that is to be electrically coupled to an adjacent upper intra-level interconnect line may merely have a larger diameter (e.g., at least equal to a width of the lower intra-level line) so that the via metallization has no lateral separation from the upper intra-level line and makes contact with a sidewall of the upper level line. In other embodiments, adjacent upper and lower interconnect lines may be electrically coupled merely by partially masking a recess etch employed to vertically separate the intra-level lines.

As also described further below, dielectric material between two metallization lines may be recessed or deposited selectively to first intra-level lines, and in a self-aligned manner. Supplemental metallization may then be deposited and planarized to form the second intra-level lines. A top surface of the supplemental metallization may either be recessed to form lower metallization lines between upper metallization lines, or planarized with dielectric material to form upper metallization lines between lower metallization lines.

FIG. 1 is a flow chart of methods 101 for vertically separating intra-level metallization lines, in accordance with some embodiments. FIG. 2A-6A illustrate a plan view of a portion of an interconnect structure 201 evolving as methods 101 are practiced, in accordance with some embodiments. FIG. 2B-6B illustrate a cross-sectional view of interconnect structure 201 along the B-B' line depicted in FIG. 2A-6A, respectively.

Referring first to FIG. 1, methods 101 begin at input 110 where a workpiece having co-planar metallization lines planarized with a surrounding dielectric material, is received. In some embodiments, the workpiece includes a semiconductor wafer, such as a large format (e.g., 300-450 mm) wafer. The wafer may include a Group IV semiconductor material layer (e.g., Si, Ge, SiGe, GeSn, etc.), or a Group III-V semiconductor material layer, or a Group II-VI semiconductor material layers, for example. The workpiece may include one or more underlying device layers including the semiconductor material layer, and may also have one or more interconnect levels interconnecting the devices (e.g. transistors). As received, the work surface of the workpiece is advantageously planar and comprises a thickness of dielectric material over any number of underlying device or interconnect metallization levels. Metallization lines over, or embedded within, this dielectric material are to become upper intra-level metallization lines.

Figure 2A:
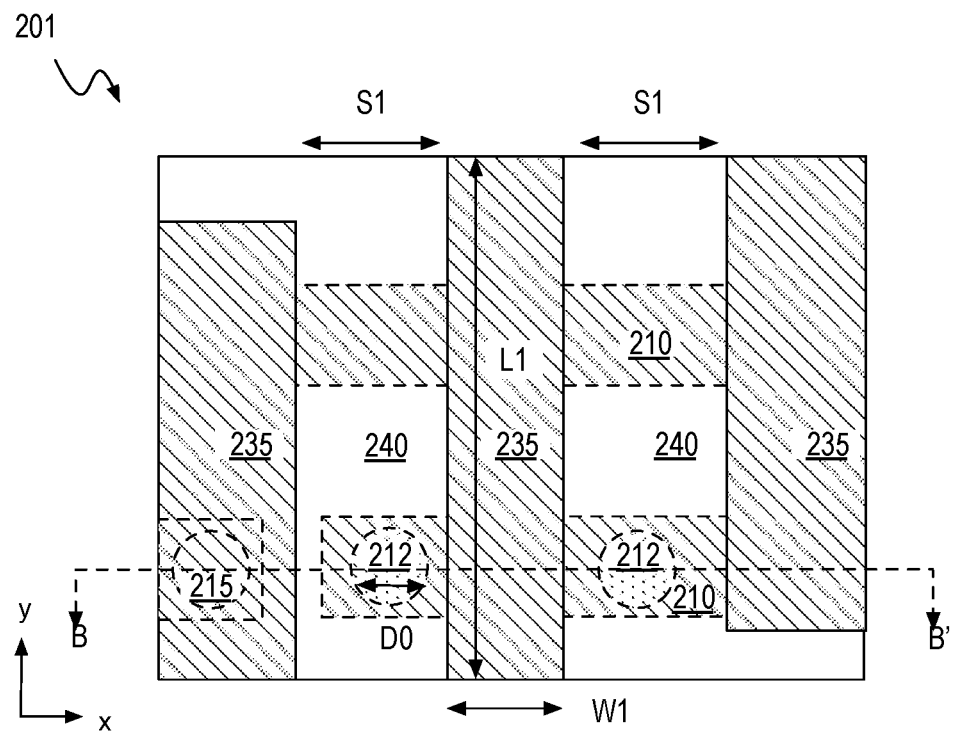
FIGS. 2A, 3A, 4A, 5A, and 6A illustrate a plan view of a portion of an interconnect structure evolving as the methods illustrated in FIG. 1 are practiced, in accordance with some embodiments.

In the example shown in FIG. 2A, a metallization line 235 is illustrated as having a longitudinal line length L1 and a transverse line width W1. As shown, various metallization lines 235 may have various longitudinal lengths with ends located as determined by a wiring mask pattern for the metallization level. Metallization lines 235 have a transverse line width W1, which may be fixed to a constant for all metallization lines 235 or it may vary across different metallization lines 235. In exemplary embodiments, line length L1 is significantly (e.g., 3×) larger than line width W1. Between adjacent metallization lines 235 there is a spacing S1. Spacing S1 may be substantially the same between all metallization lines 235, or spacing S1 may also vary between different metallization lines. Spacing S1 may be approximately equal to line width W1, or it may be smaller or larger than line width W1.

Figure 2B:
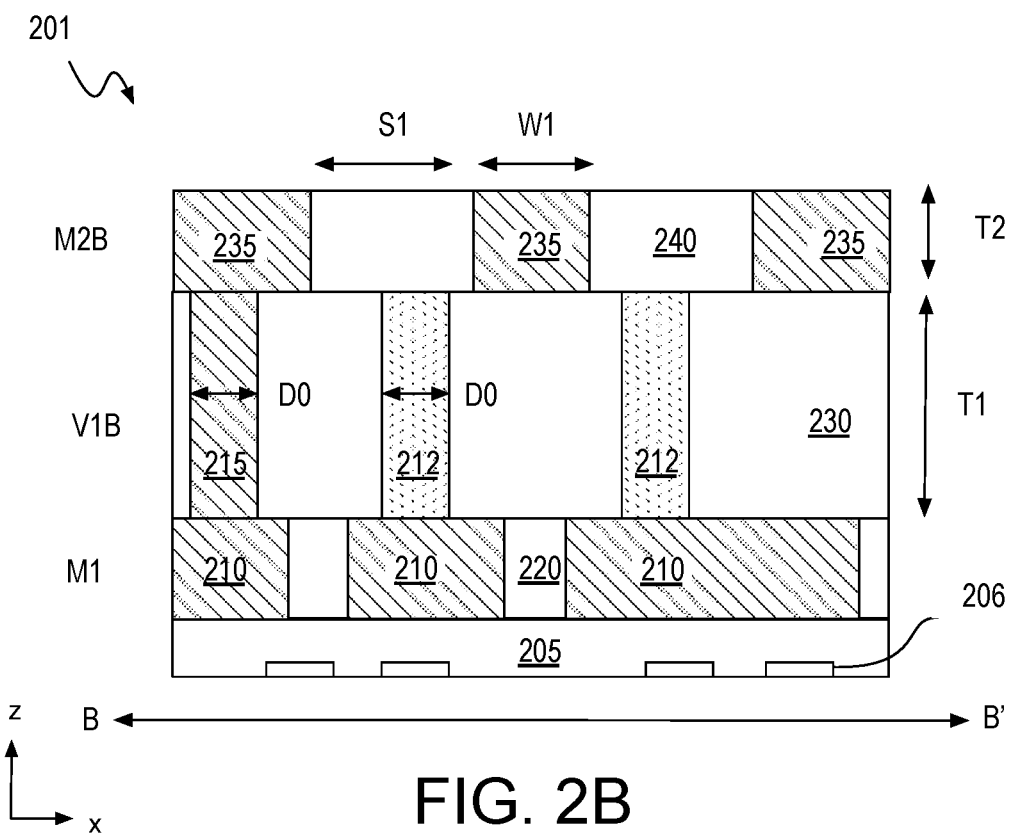
FIGS. 2B, 3B, 4B, 5B, and 6B illustrate a cross-sectional view of a portion of an interconnect structure evolving as the methods illustrated in FIG. 1 are practiced, in accordance with some embodiments.

As shown in FIG. 2B, a lower interconnect level (e.g., M1) includes metallization lines 210 embedded within dielectric material 220. In other embodiments, there may be no lower interconnect level, and instead only a device level. In the illustrated example, metallization lines 210 are designated as a M1 interconnect plane while metallization lines 235, being the upper lines of a second interconnect level, are designated as a M2B level. Via metallization 215 extends through a dielectric material 230 between one of the metallization lines 210 and one of the metallization lines 235. Via metallization 215 has a maximum lateral diameter D0, which may vary with implementation, but is generally significantly smaller than the length of the line metallization (e.g., DO is significantly smaller than line length L1). In the illustrated example, diameter D0 is also smaller than line width W1. In other embodiments, as noted further below, diameter D0 may in some instances be larger than line width W1 and/or via metallization 215 may otherwise extend beyond an edge or sidewall of metallization line 235. Via metallization 215 is designated as V1B because it is coupled to metallization lines 235 in the M2B level, which are only the first metallization lines of the second interconnect level.

In addition to via metallization 215, a via dielectric 212 is further illustrated to emphasize that that via metallization may entail more than one patterning iteration and/or more than one via fill iteration. Via dielectric 212 is located where there are no metallization lines 235. In this example, all V1 patterning has been completed prior to fabricating metallization lines 235 and via dielectric 212 serves as a placeholder for additional V1 via metallization that is to be subsequently formed. As such, via dielectric 212 similarly has a maximum diameter D0 that may vary. In alternative embodiments, via metallization 215 may be everywhere via dielectric 212 is depicted in FIG. 2A, 2B. In still other embodiments, for example as further described elsewhere herein, additional V1 openings may be formed only after trenches for additional M2 metallization lines are formed.

Metallization via 215 (and dielectric via 212) has a height substantially equal to a thickness T1 of dielectric material 230. Thickness T1 may vary with implementation, but in some exemplary embodiments is 5 nm-50 nm. Dielectric material 230 is substantially coplanar with a top of metallization via 215. Dielectric material 240 has a thickness T2 over the top of vias 212, 215, and over dielectric material 230. Thickness T2 may also vary with implementation, but in some exemplary embodiments is 5-20 nm. Dielectric materials 220, 230 and 240 may have any composition suitable for electrical isolation of integrated circuitry. Dielectric materials 220, 230 and 240 may have substantially the same composition, and may all be a low-k dielectric material (e.g., SiOC) having a relative permittivity below 3.5, for example. In other examples, dielectric materials 220, 230 and 240 may be any of SiO, SiON, hydrogen silsesquioxane, methyl silsesquioxane, polyimide, polynorbornenes, benzocyclobutene, or the like. Dielectric materials 220, 230 and 240 may be deposited as a flowable oxide, for example, and have substantially planar top surfaces. If present, dielectric via 212 may comprise any dielectric material that may be removed selectively dielectric material 230. For example, dielectric via 212 may comprise a carbonaceous material (e.g., diamond-like carbon).

Metallization lines 210 and 235, as well as metallization via 215 may be any metallic composition suitable for electrical routing within integrated circuitry. Metallization lines 210 and 235, as well as metallization via 215 may all comprise substantially the same metal (e.g., predominantly one of Cu, Ru, W, Mo, Co, or Al), for example.

As further shown in FIG. 2B, interconnect structure 201 is over a portion of an underlying substrate that includes a device layer 205. Within device layer 205 there are a plurality of devices 206. In exemplary embodiments, devices 206 are metal-oxide-semiconductor (MOS) structures, however devices 206 may also be other transistor types, such as, but not limited to, other FET architectures (TFET, TFT), bipolar junction transistors, or other devices including one or more semiconductor junctions (e.g., diodes, etc.).

Returning to FIG. 1, methods 101 continue at block 120 where the dielectric material between the metallization lines is recessed, for example, with an anisotropic etch process. The recess etch at block 120 defines locations where lower intra-level metallization lines are to be located. The recess etch is at least partially self-aligned to the metallization lines with the metallization lines masking the dielectric etch. The recess etch performed at block 120 may be further masked by a patterned mask material (not depicted) such that dielectric material within some regions between adjacent metallization lines is retained (not recessed).

Figure 3A:
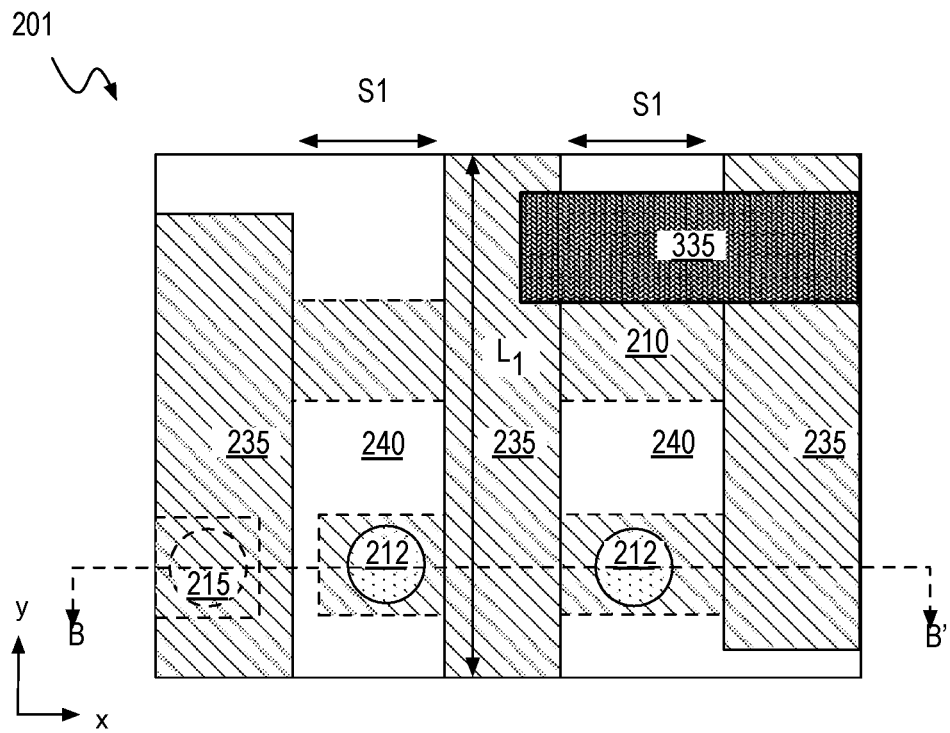
Figure 3B:
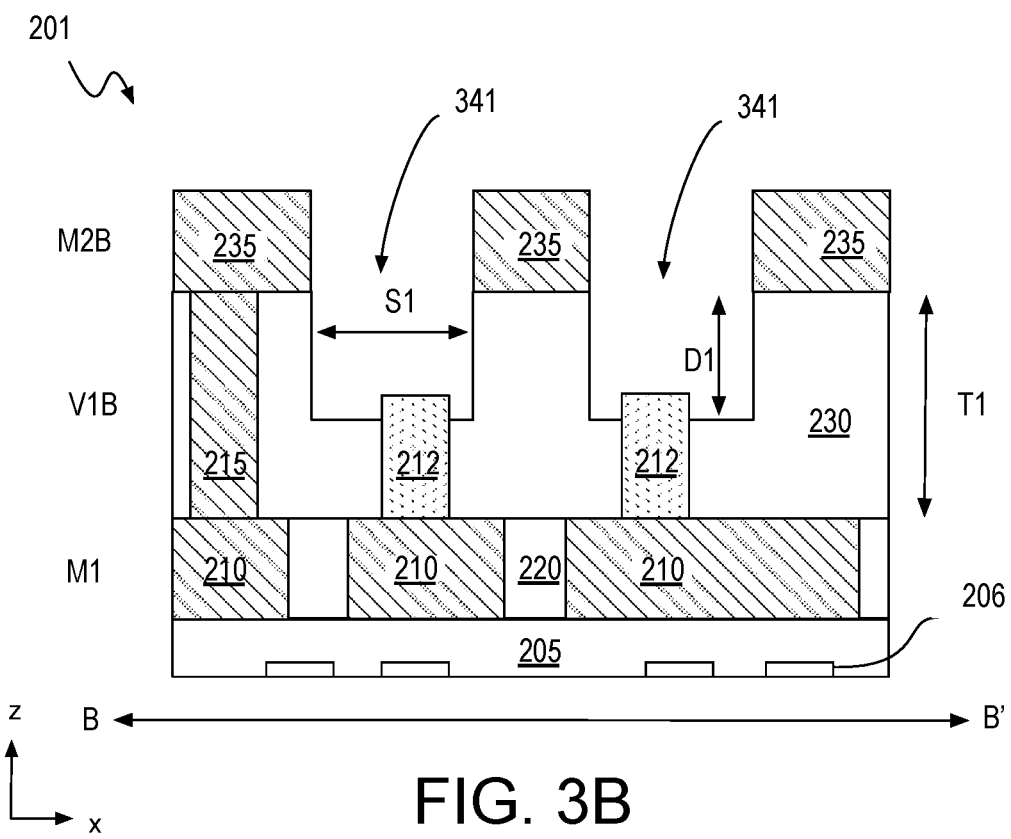

In the example further illustrated in FIGS. 3A and 3B, an anisotropic etch has formed trenches 341 in interconnect structure 201. The anisotropic etch may include any plasma/ RIE etch process suitable for dielectric material 230 (e.g., based on a CxFy plasma chemistry) as embodiments are not limited in this respect. Although trenches 341 are depicted with ideal profiles having substantially vertical (e.g., z-dimension) sidewalls, it is appreciated that trenches 341 may instead have other profiles, for example with tapered sidewall slopes and a top width being slightly larger than a bottom width, etc. As illustrated, in the absence of an additional patterned mask layer 335, trenches 341 span the line length L1. The width of trenches 341 is substantially equal to spacing S1 between adjacent metallization lines 235. Trenches 341 are therefore at least partially self-aligned to metallization lines 235 and patterned mask layer 335 may provide for end-to-end spaces between trenches 341.

Trenches 341 may be recessed to any predetermined depth D1 below a bottom of metallization lines 235 either by practicing a timed dielectric etch, or by incorporating an etch stop layer (not depicted) within dielectric material 230. Depth D1 is less than dielectric thickness T1 so that metallization lines 210 are not exposed in the bottom of trenches 341. In some examples, recess etch depth D1 is 5-50 nm. Trenches 341 may however expose vias within dielectric material 230. In the illustrated example, via metallization 215 is not exposed by trenches 341 because of its smaller maximum diameter D0. For alternative embodiments where via metallization 215 has a sufficiently large maximum diameter D0 that it extends beyond an edge of metallization lines 235, trenches 341 would expose some portion of via metallization 215.

As further illustrated, the dielectric recess etch exposes via dielectric 212 within trenches 341. Via dielectric 212 may also be recessed at some finite rate as a function of the selectivity of the etch process (with via dielectric 212 etching either faster or slower than dielectric material 230). Any via dielectric 212 remaining after the formation of trenches 341 may be removed with another etch process that is selective to dielectric material 230. For embodiments where via dielectric 212 is instead via metallization 215, high etch selectivity may result in pillars of via metallization within trenches 341. The pillars may be retained as a permanent component of interconnect structure 201.

Returning to FIG. 1, methods 101 continue at block 130 where additional metallization is deposited over the workpiece, filling any openings (e.g., trench and via) that were patterned into the dielectric material. Following metal deposition, the workpiece surface is planarized, for example with a CMP process, so that a top surface of the deposited metal is co-planar with adjacent metallization lines. Any metallization process may be employed at block 130 to deposit any metal suitable for IC interconnect lines. A damascene-type process where the metallization is deposited into a trench and then planarized facilitates vertical separation of intralevel metallization lines. In some exemplary embodiments, the metallization deposited at block 130 can be chemically etched more readily than Cu-based metallizations. The metallization deposited at block 130 also advantageously has a different composition than adjacent metallization lines within the same interconnect level.

Figure 4A:
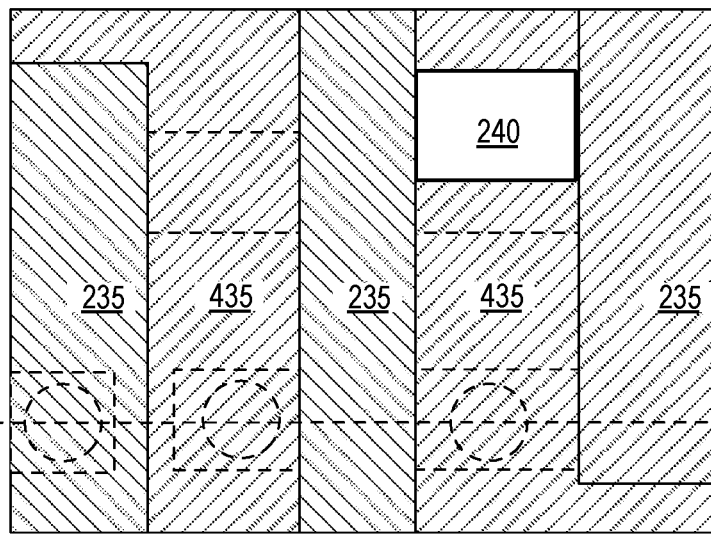
Figure 4B:
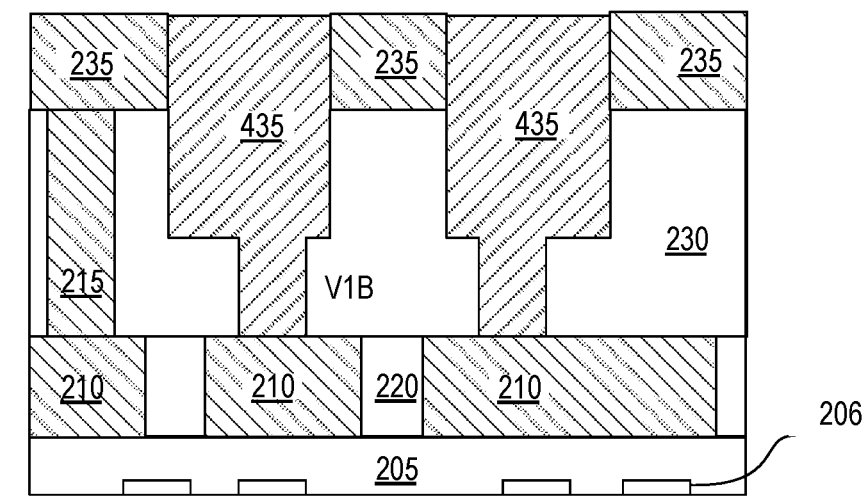

In the example further illustrated in FIGS. 4A and 4B, metallization 435 has been deposited into the trenches between metallization lines 235. Metallization 435 has been planarized so that its top surface is substantially co-planar with a top surface of metallization lines 235 and any portion of dielectric material 240 that was protected from the trench etch. At this point, metallization 435 is in contact with metallization lines 235 (i.e., electrically shorted). As further illustrated, metallization 435 also forms a via metallization VIA, the second via metallization (along with V1B) contacting metallization lines 210 of interconnect level M1. Metallization 435 may include one or more layer of metal or metal alloy suitable for electrical routing within integrated circuitry. Metallization 435 advantageously has a different composition than metallization lines 235 so that metallization 435 can be subsequently etched back selectively to metallization lines 235. In some embodiments where metallization lines 235 comprise predominantly Cu, metallization 435 is other than Cu. For example, metallization 435 may comprise predominantly one of Ru, W, Mo, Co, or Al. In some other embodiments where metallization lines 235 is instead predominantly a first of Ru, W, Mo, Co, or Al, metallization 435 is predominantly a second of Ru, W, Mo, Co, or Al.

Returning to FIG. 1, methods 101 continue at block 140 where the metallization deposited at block 130 is recessed selectively relative to the adjacent metallization lines (i.e., the adjacent metallization lines etch less rapidly). At block 140, a mask material (e.g., a photosensitive material) may first be patterned to define plugs where the metallization will be protected from etch and therefore not recessed. Such a metal plug will maintain electrical interconnection between the metallization and adjacent metallization lines on two sides of the plug. In regions exposed to the etch process, the top surface of the metallization that was deposited at block 130 is recessed to a depth below a bottom of the adjacent metallization lines. The metal recess etch performed at block 140 vertically separates second metallization lines from the adjacent first metallization lines. The etch process performed at block 140 may be conducted for a predetermined time to reach a desired vertical depth. Any etch process suitable for the chosen metallization may be practiced at block 140. In some embodiments, the etch process is a plasma/RIE etch. However, in other embodiments a wet chemical etch is performed. The etch process may be isotropic to the extent that any desired plug pattern can still be maintained.

Figure 5A:
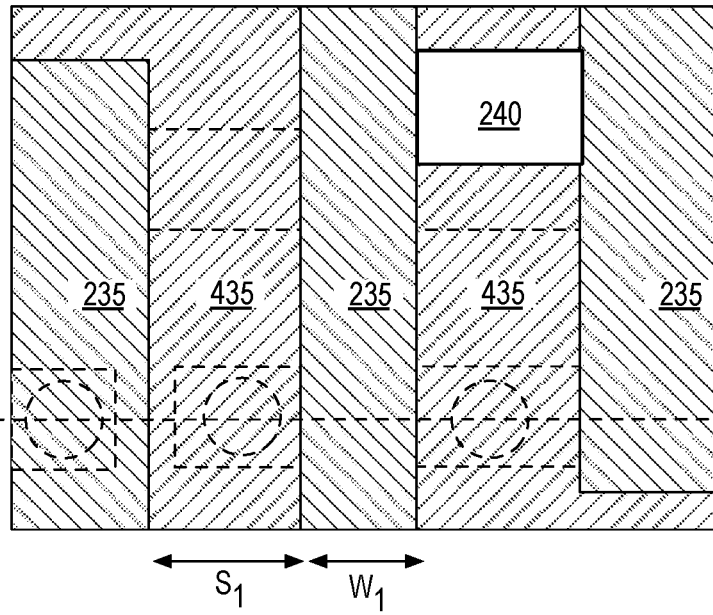
Figure 5B:
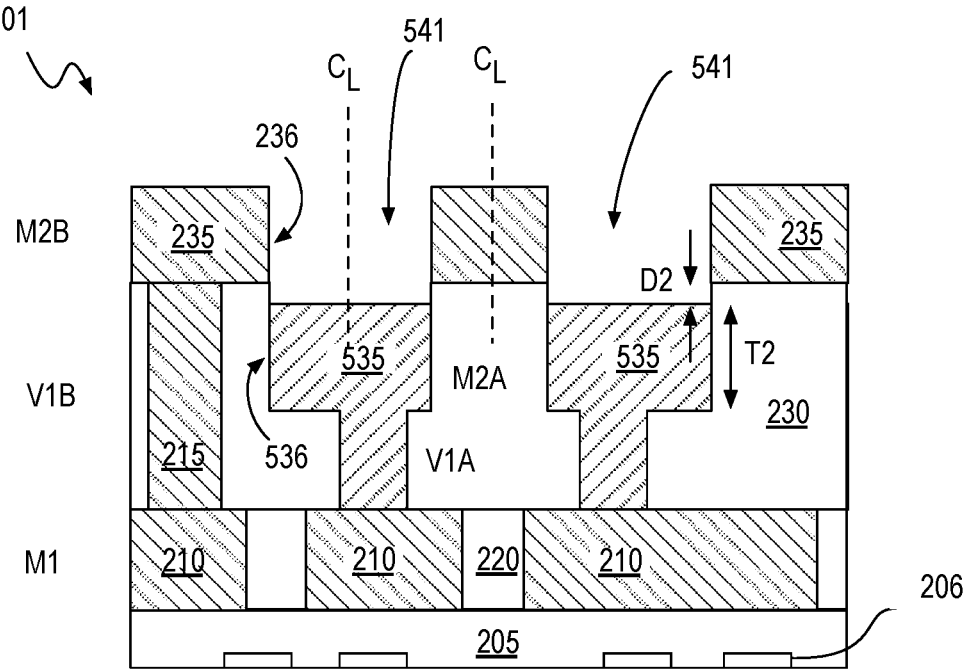

In the example further illustrated in FIG. 5A and FIG. 5B, a top surface of metallization 435 has been etched back, or recessed, sufficiently to generate separate metallization lines 535. Metallization lines 535 are at a bottom of a trench 541, which has some depth D2 of dielectric material 230 between a top of metallization lines 535 and a bottom of metallization lines 235. Metallization lines 535 therefore have a thickness T2 that is substantially equal to a difference between the trench depth D1 (FIG. 2B) minus the depth D2 (FIG. 5B). Because metallization lines 535 occupy a trench formed with an etch that was self-aligned to metallization lines 235, a centerline $C_L$ of width W1 of each metallization line 535 is coincident with the centerline $C_L$ of the space between adjacent metallization lines 235. Likewise, a centerline of $C_L$ of each metallization line 535 is coincident with the centerline $C_L$ of the space S1 between adjacent metallization lines 235. This will be true even if there are differences in pitch between metallization lines 235 and 535, for example as a result of a dimensional bias in the formation of metallization lines 535. As shown in FIG. 5B, there is substantially no lateral separation between metallization lines 235 and 535 with metallization lines 535 having a width substantially equal to spacing S1 between metallization lines 235. In other words, metallization line sidewall 536 has zero lateral offset from metallization lines sidewall 236. As further shown in FIG. 5A, the fill factor of metallization lines 235 and 535 is 100% within interconnect structure 102. As further shown in FIG. 5B, metallization lines 535 are lower lines (e.g., M2A) within interconnect level M2 while metallization lines 235 are upper lines (e.g., M2B) within interconnect level M2. Hence, although such high line fill factor might otherwise be electrically shorted or suffer unacceptably high parasitic capacitance, the vertical separation (e.g., z-dimension) between metallization lines 235 and 535 provides electrical isolation and significantly reduces adjacent line parasitics. Hence, vertical separation of the intra-level (M2A-M2B) metallization lines can reduce electrical resistance and increase line density by increasing the line fill factor while controlling intra-level parasitic capacitance.

As further illustrated in FIG. 5B, because via metallization 215 has a smaller diameter than the line width of an overlying one of metallization 235 lines, metallization lines 535 are laterally separated from via metallization 215 by dielectric material 230. Metallization lines 535 are therefore electrically isolated from via metallization 215. For embodiments where via metallization is either offset from an edge of metallization lines 235, or of sufficiently large maximum diameter D0 to be exposed during the dielectric recess etch, a nearest one of metallization lines 535 would be in direct contact with via metallization 215.

Returning to FIG. 1, methods 101 continue at block 150 where the trenches formed over the lower metallization lines (and between the upper metallization lines) are at least partially backfilled with dielectric material. The backfilling may proceed according to one or more deposition techniques, such as, but not limited to (flowable) chemical vapor deposition (CVD), etc. The dielectric deposited may have any composition known to be suitable for IC interconnect isolation. Following deposition, a top surface of the dielectric may be planarized, for example with any CMP process, so that the top surface of the upper metallization lines is again coplanar with a top surface of dielectric material. At this point methods 101 are substantially complete with the interconnect structure now ready for an additional level of interconnect metallization, which may be formed according to any technique(s). In exemplary embodiments, methods 101 end at output 170 following the formation of an additional level of interconnect metallization that includes via metallization to both the upper (first) and lower (second) metallization lines.

Figure 6A:
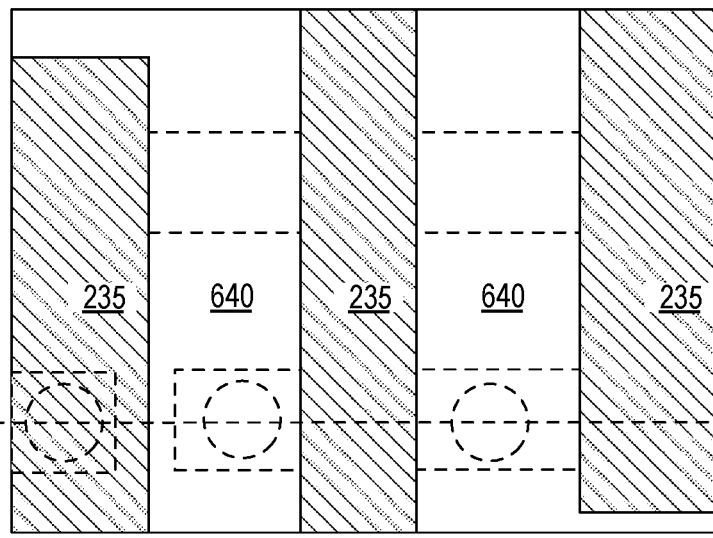
Figure 6B:
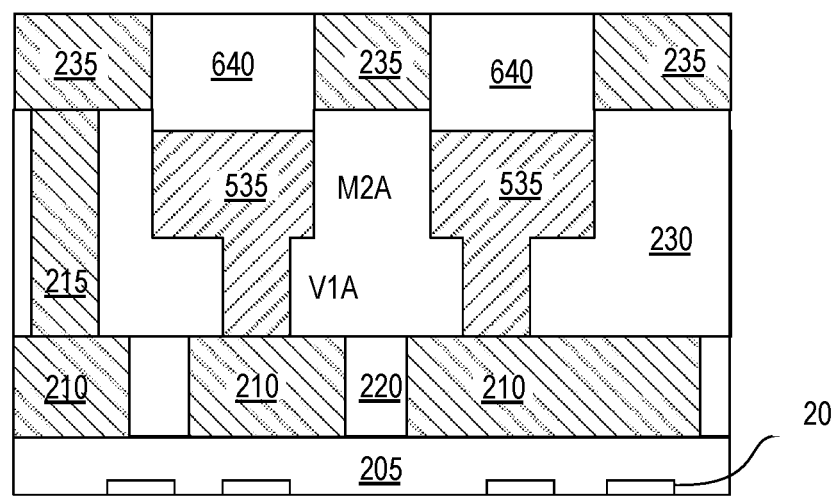

In the example further illustrated in FIGS. 6A and 6B, interconnect structure 201 includes a dielectric material 640 that has a top surface substantially co-planar with a top of metallization lines 235. Metallization lines 535 are below dielectric material 640, and are therefore in a lower plane (M2A) of interconnect level M2. Metallization lines 235, being over metallization lines 535 are therefore in an upper plane (M2B) of interconnect level M2.

Figure 7:
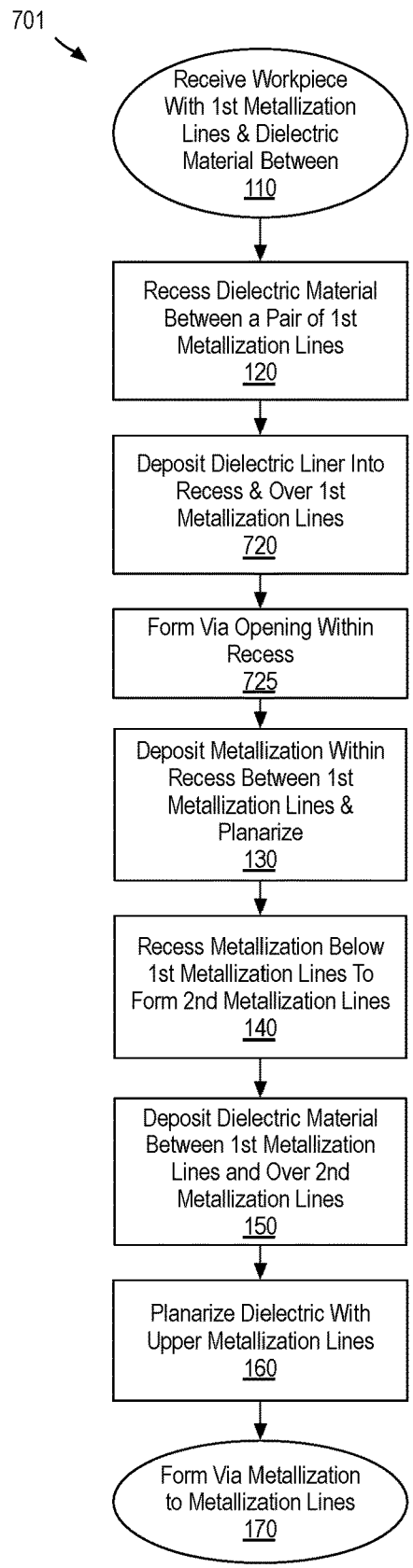
FIG. 7 is a flow chart of methods of vertically spacing intra-level metallization lines, in accordance with some alternative embodiments.

FIG. 7 is a flow chart of methods 701 for vertically spacing self-aligned intra-level metallization lines, in accordance with some alternative embodiments. Methods 701 are well suited to vertically spacing self-aligned intra-level metallization lines that have substantially the same composition. FIG. 8A-14A illustrate a plan view of a portion of an interconnect structure 801 evolving as methods 701 are practiced, in accordance with some embodiments. FIG. 8B-14B illustrate a cross-sectional view of interconnect structure 801 along the B-B' line depicted in FIG. 8A-14A, respectively. For FIG. 7-14, a feature retaining the reference label of a feature introduced above in the context of FIG. 1-6 may have any of the attributes previously described for that feature.

Referring first to FIG. 7, methods again begin at input 110 where a workpiece having a first metallization lines and dielectric material between the first metallization lines is received. The workpiece may include one or more underlying device layers including the semiconductor material layer, and may also have one or more interconnect levels interconnecting the devices (e.g. transistors). As received, the work surface of the workpiece is advantageously planar and comprises a thickness of dielectric material over any number of underlying device or interconnect metallization levels. Metallization lines over, or embedded within, this dielectric material are again to become upper intra-level metallization lines.

Methods 701 continue at block 120 where the dielectric material between adjacent pairs of the metallization lines is recessed, for example selectively to the metallization lines. The dielectric recess etch at block 120 defines locations where lower intra-level metallization lines are to be located. This etch is at least partially self-aligned to the metallization lines masking the dielectric etch. The recess etch performed at block 120 may be further masked by a patterned mask material (not depicted) so that dielectric material within some regions between adjacent metallization lines may be retained (not recessed).

At block 720, methods 701 deviate from methods 101 (FIG. 1) with the deposition of a dielectric liner material into the trenches formed at block 120, and over the metallization lines adjacent to the trenches. The dielectric material is advantageously a thin film having at thickness of 2-10 nm, for example. The dielectric liner material is advantageously deposited with a substantially conformal deposition process so that the film thickness varies by less than <15% between surfaces parallel to a plane of the workpiece and surfaces substantially orthogonal to the plane of the workpiece).

Figure 8A:
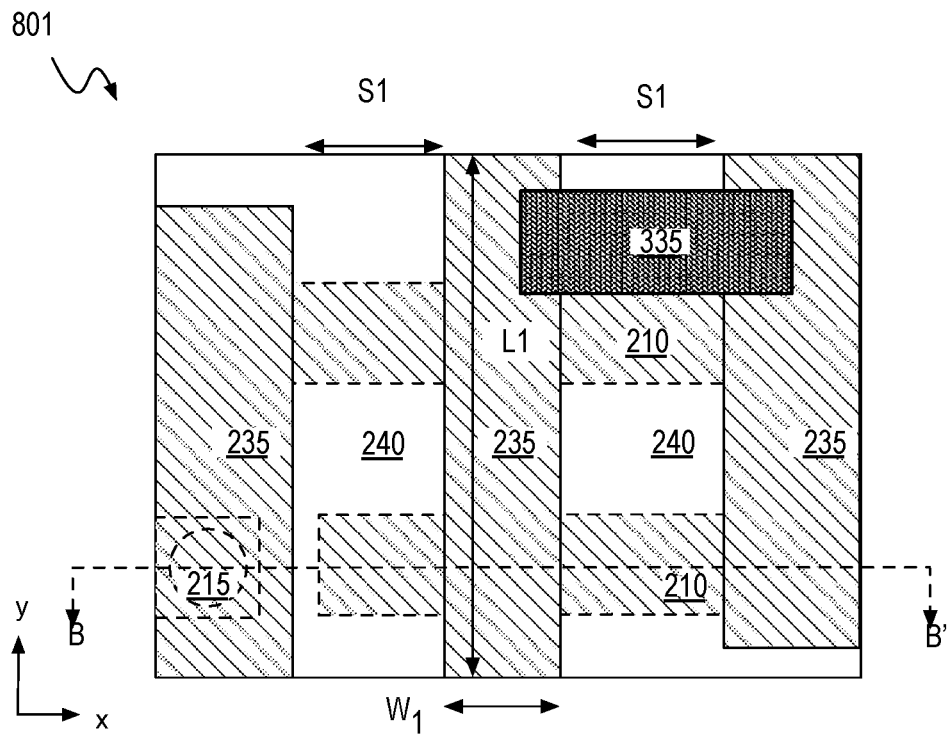
FIGS. 8A, 9A, 10A, 11A, 12A, 13A and 14A illustrate a plan view of a portion of an interconnect structure evolving as the methods illustrated in FIG. 7 are practiced, in accordance with some embodiments.
Figure 8B:
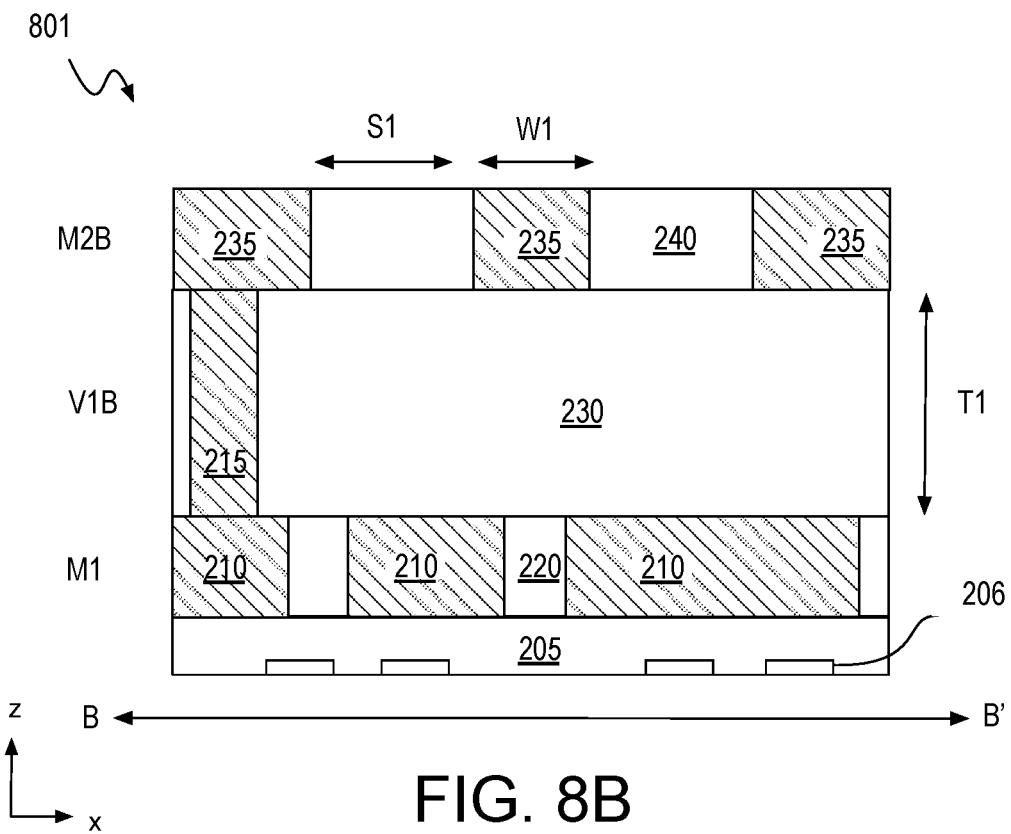
FIGS. 8B, 9B, 10B, 11B, 12B, 13B and 14B illustrate a cross-sectional view of a portion of an interconnect structure evolving as the methods illustrated in FIG. 7 are practiced, in accordance with some embodiments.

In the example further illustrated in FIGS. 8A and 8B, an interconnect structure 801, when received as a starting material, has many of the same structures of interconnect structure 201. In the example shown in FIGS. 8A and 8B, metallization lines 235 again have a line length L1 that is significantly larger than line width W1. There is a spacing S1 between adjacent metallization lines 235. Via metallization 215 interconnects one of the metallization lines 235 to metallization line 210 of an underlying metallization level M1. In this example, interconnect structure 801 lacks any dielectric vias. Mask material layer 335 may be optionally present to protect various regions.

Figure 9A:
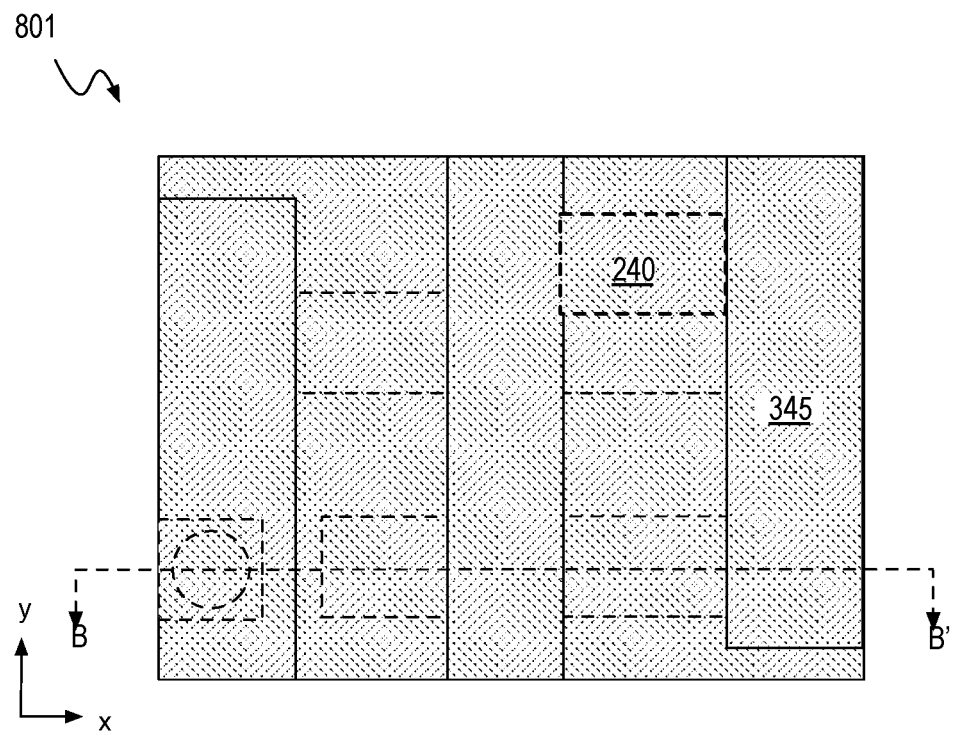
Figure 9B:
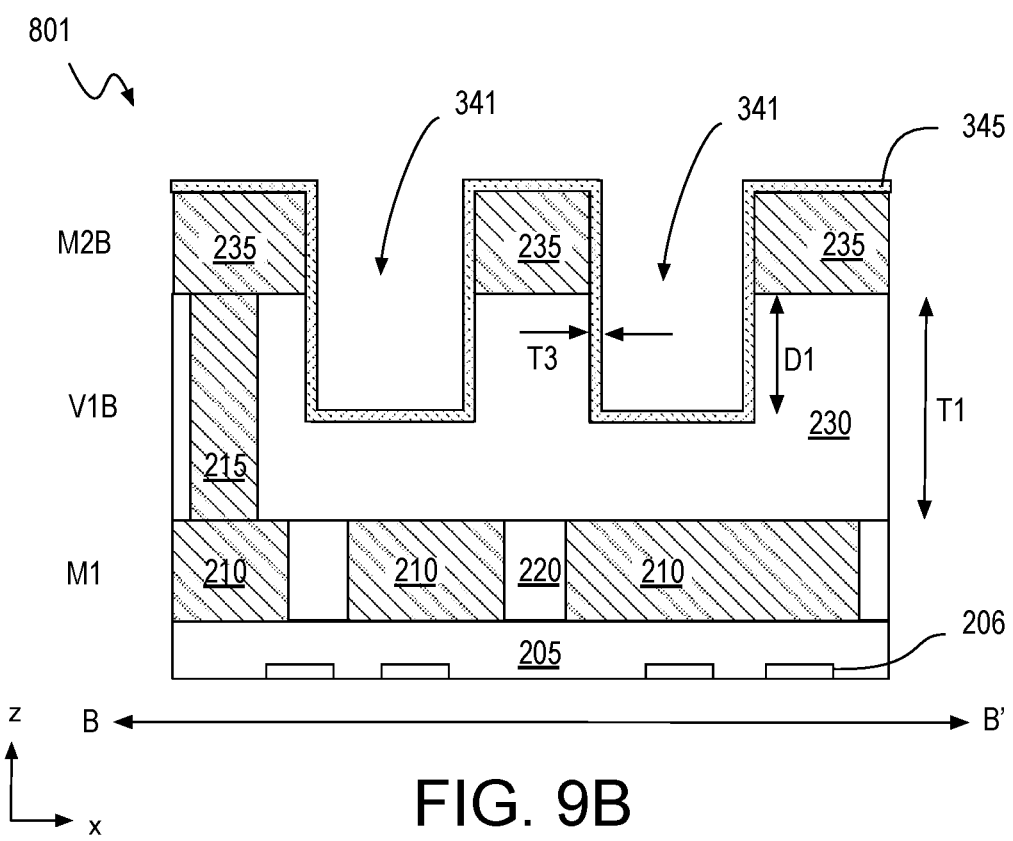

FIGS. 9A and 9B illustrate interconnect structure 801 following a recess etch of dielectric materials 240 and 230 to form trenches 341 aligned to a sidewall of metallization lines 235. In the absence of an additional patterned mask layer, trenches 341 span the line length L1. The width of trenches 341 is substantially equal to spacing S1 between adjacent metallization lines 235. Trenches 341 may be recessed to any predetermined depth D1 below a bottom of metallization lines 235. As further shown by FIGS. 9A and 9B, a dielectric liner material 345 has been deposited into trenches 341 and over metallization lines 235. Dielectric liner material 345 has a substantially conformal thickness T3, for example of less than 10 nm. Dielectric liner material 345 may have any composition, such as any of those described for dielectric material 230, or one having a higher relative permittivity (e.g., $HfO_2$, $ZrO$, $Al_2O_3$).

Returning to FIG. 7, methods 701 continue at block 725 where via openings are formed within the trench recesses.

Methods 701 are therefore one example of a double via patterning technique that may be employed as an alternative to the technique described for methods 101. Any masking and etch process may be employed at block 725 to form additional vias down to underlying metallization lines.

Figure 10A:
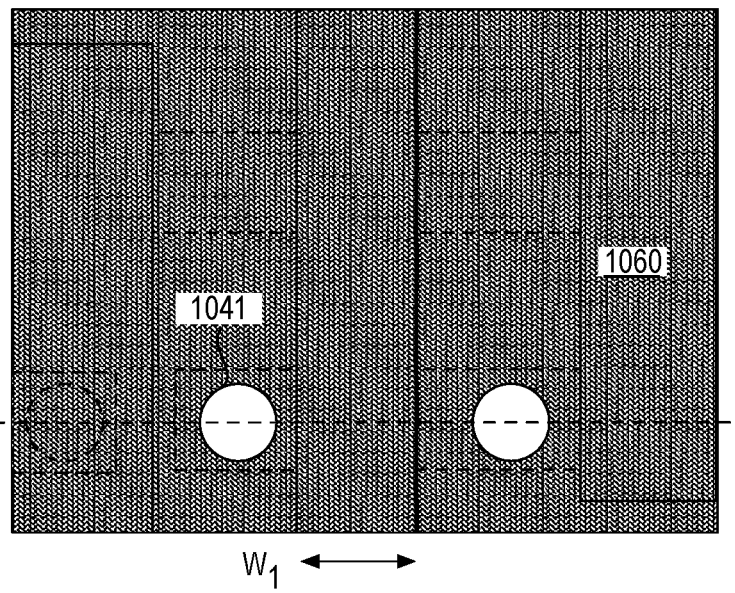
Figure 10B:
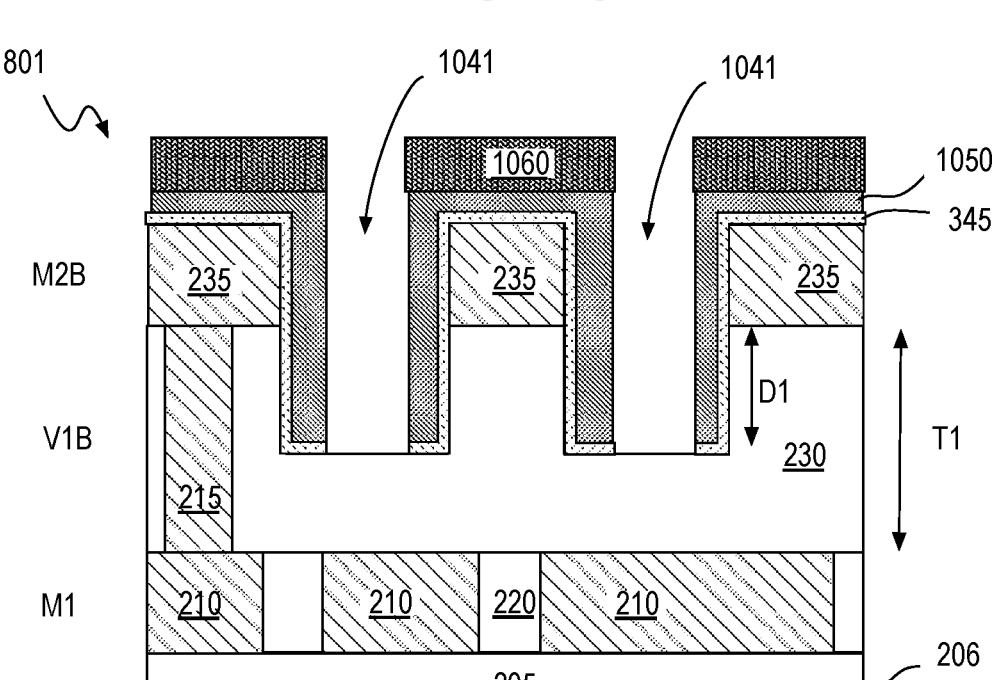
Figure 11A:
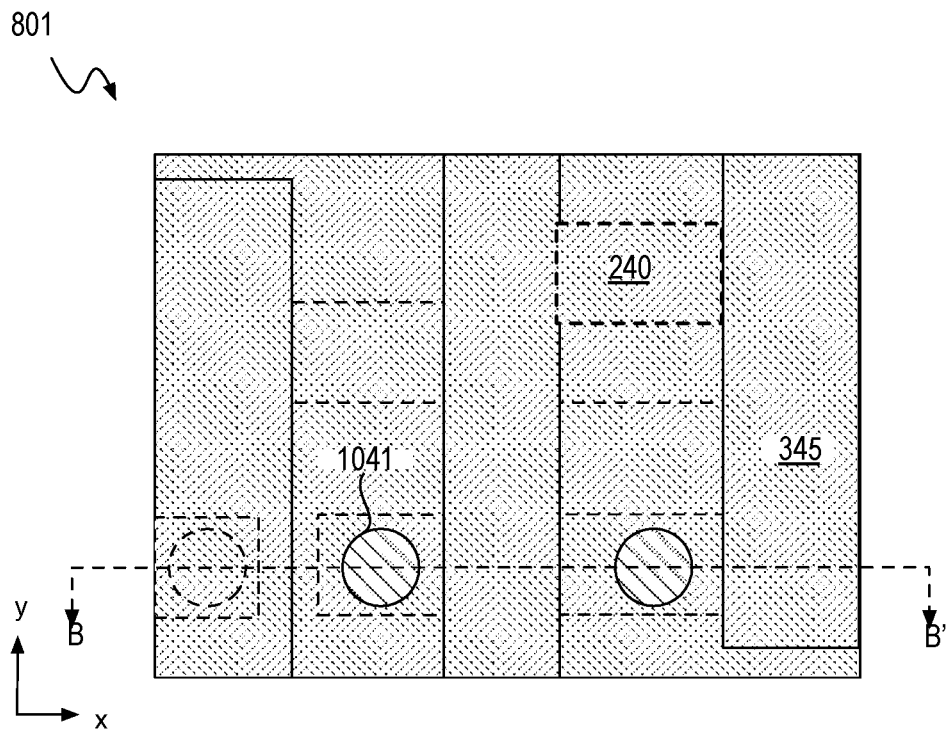
Figure 11B:
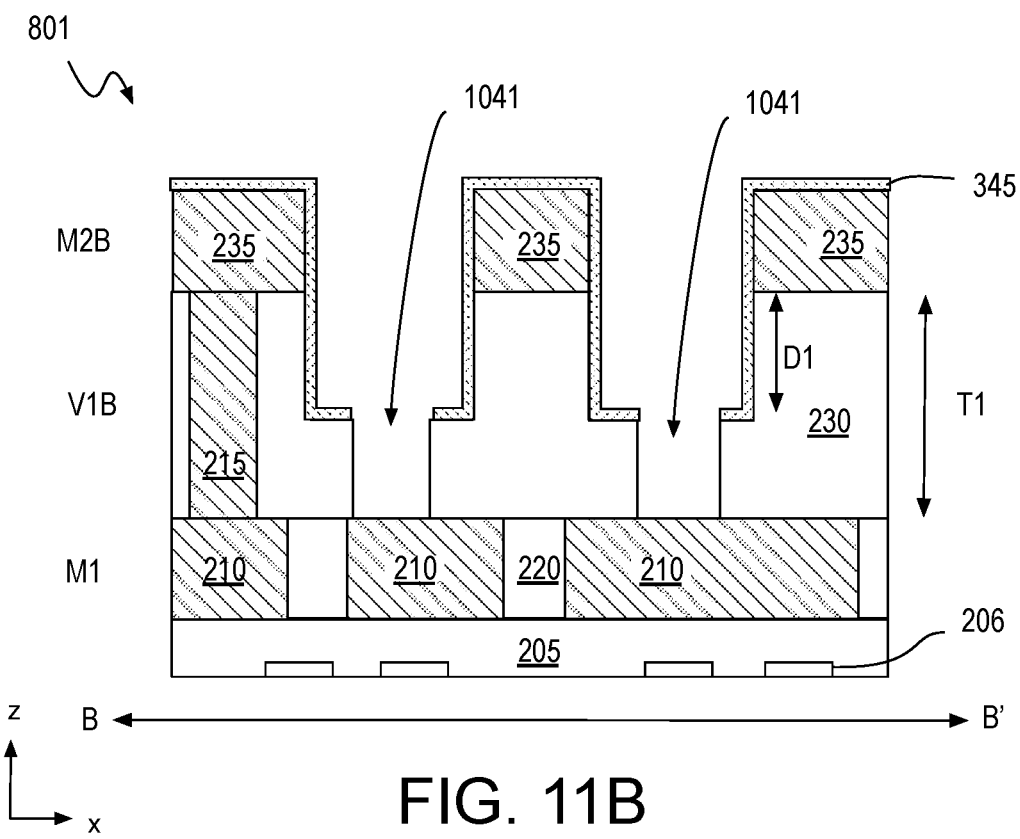

In the example further illustrated in FIGS. 10A and 10B, a sacrificial material 1050 has been planarized over the workpiece. Sacrificial material 1050 may have any composition that is amenable to anisotropic etching, such as, but not limited to, carbonaceous materials like DLC. A mask material 1060 is patterned over sacrificial material 1050. Mask material 1060 may be a photosensitive material (e.g., resist) in which a via pattern has been exposed and developed, or mask material 1060 may be a hardmask material that has been etched according to via pattern. As further illustrated, vias 1041 are etched through sacrificial material 1050, and through dielectric liner material 345. As further illustrated in FIGS. 11A and 11B, vias 1041 are further etched through dielectric material 230 to expose metallization lines 210. Sacrificial material 1050 and mask material 1060 may be removed during and/or following delineation of vias 1041. Following via etch, dielectric liner material 345 remains over a top surface of metallization lines 235.

Returning to FIG. 7, methods 701 continue at block 130 where metallization is deposited within the trenches (and vias), and the metallization is planarized with the adjacent metallization lines. Any metallization process may be employed at block 130 to deposit any metal suitable for IC interconnect lines. In some exemplary embodiments, the metallization deposited at block 130 can be chemically etched more readily than Cu-based metallizations. The metallization deposited at block 130 may advantageously have substantially the same composition as the adjacent metallization lines. However, the metallization deposited at block 130 may also have a different composition than the adjacent metallization lines.

Figure 12A:
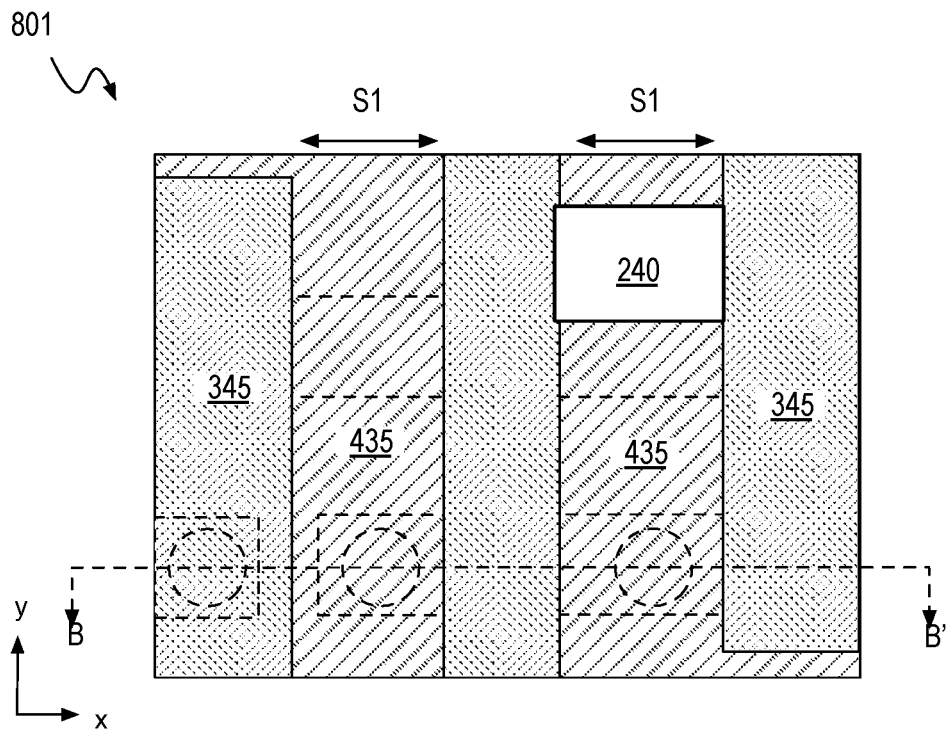
Figure 12B:
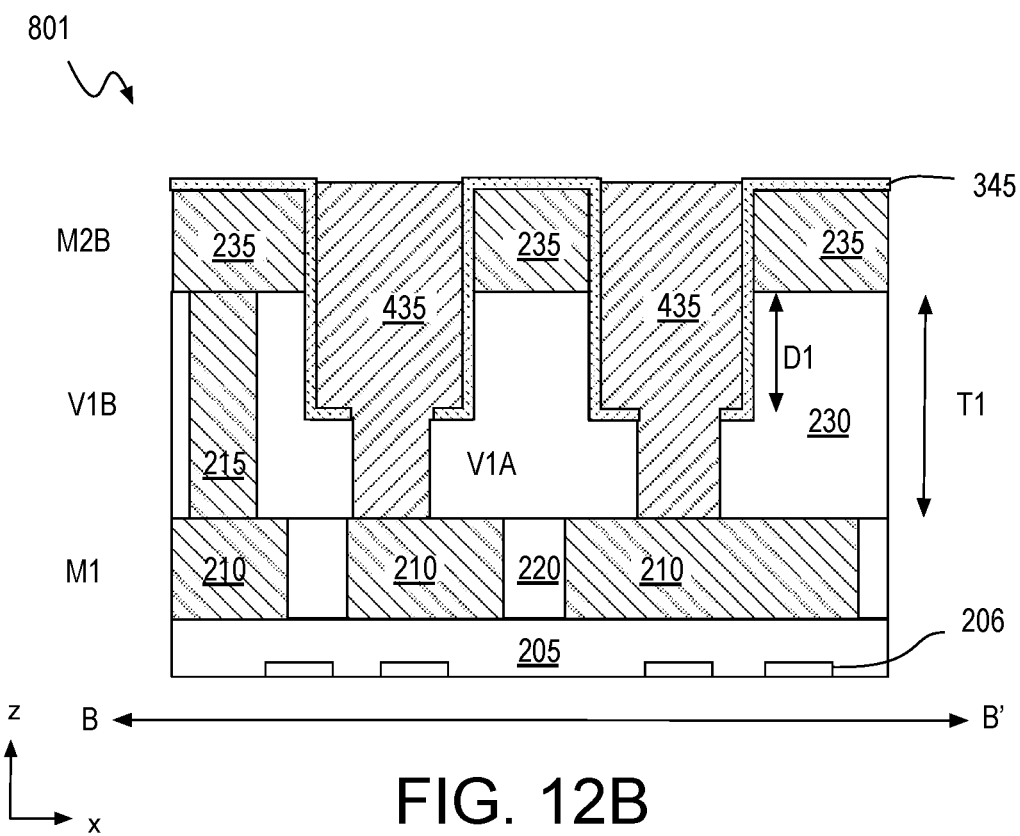

In the example further illustrated in FIGS. 12A and 12B, metallization 435 has been deposited into the trenches between metallization lines 235 Metallization 435 has been planarized so that its top surface is substantially co-planar with a top surface of metallization lines 235 and any portion of dielectric material 240 that was protected during the otherwise self-aligned trench etch. At this point, metallization 435 is laterally separated from metallization lines 235 by dielectric liner material 345. As further illustrated, metallization 435 also provides another via metallization VIA contacting metallization lines 210 of interconnect level M1. Metallization 435 may include one or more layers of metal or metal alloy suitable for electrical routing within integrated circuitry. Metallization 435 may have the same composition as metallization lines 235 because portions of dielectric liner material 345 that remain over metallization 235 can mask/protect metallization 235 while metallization 435 is subsequently etched back selectively to dielectric liner material 345. In some embodiments where metallization lines 235 is predominantly one of Ru, W, Mo, or Al, metallization 435 is also predominantly the same one of Ru, W, Mo, Co, or Al.

Returning to FIG. 7, methods 701 continue at block 140 where the metallization deposited at block 130 is recessed below the adjacent metallization lines to form additional metallization lines at a lower plane of the interconnect level. During the metallization etchback process, the top surface of the metallization is recessed to a depth below a bottom of the adjacent metallization lines. The etch process performed at block 140 may be conducted for a predetermined time to reach a desired vertical depth/separation between the adjacent lines. Any etch process suitable for the chosen metallization may be practiced at block 140. In some embodiments, the etch process is a plasma/RIE etch. However, in other embodiments a wet chemical etch is performed.

Figure 13A:
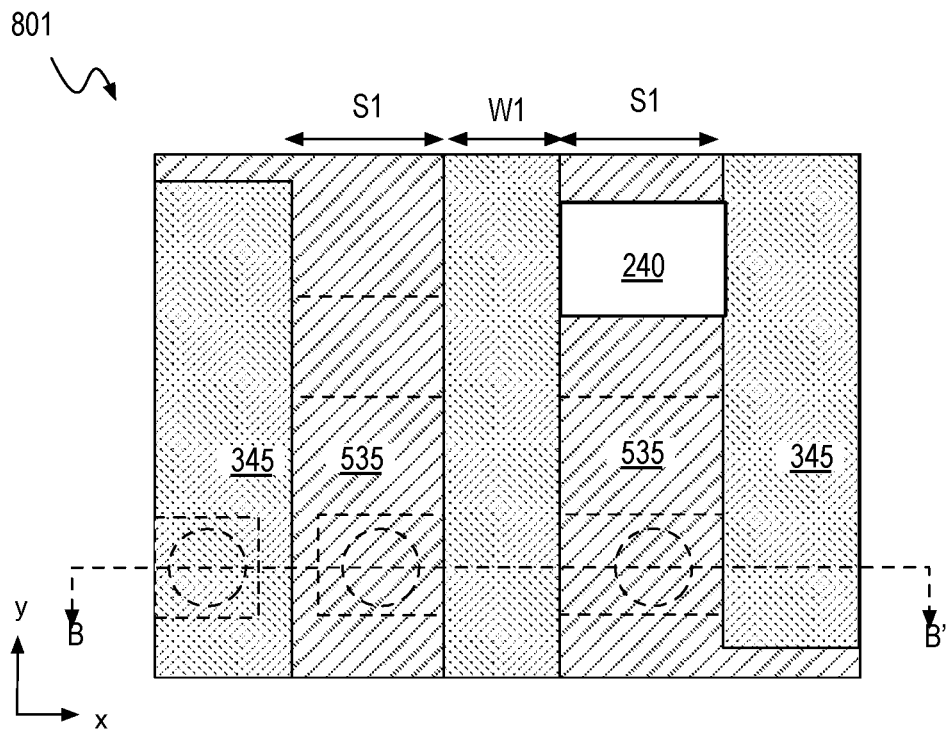
Figure 13B:
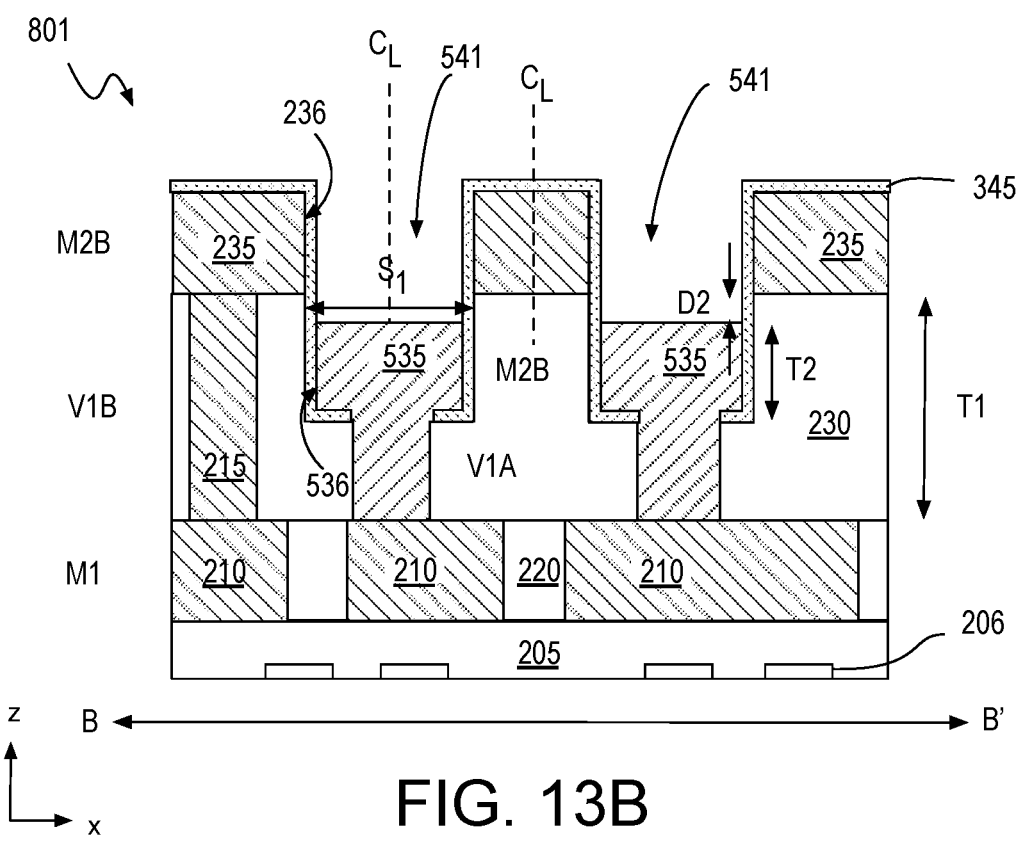

In the example illustrated in FIGS. 13A and 13B, metallization 435 has been recessed to form metallization lines 535. A top surface of metallization 535 has been recessed as a bottom of a trench 541, which has some depth D2 of dielectric material 230 between a top of metallization lines 535 and a bottom of metallization lines 235. Metallization lines 535 therefore have a thickness T2. Because metallization lines 535 again occupy a trench formed with an etch that was self-aligned to metallization lines 235, a centerline $C_L$ of width W1 of each metallization line 535 is again coincident with the centerline $C_L$ of the space between adjacent metallization lines 235. Likewise, a centerline of $C_L$ of each metallization line 535 is coincident with the centerline $C_L$ of the space S1 between adjacent metallization lines 235. This will be true even if there are differences in pitch between metallization lines 235 and 535, for example as a result of a dimensional bias in the formation of metallization lines 535 resulting by the non-zero thickness of dielectric liner material 345. As shown in FIG. 13B, a minimal thickness of dielectric liner material 345 lateral separates metallization lines 235 and 535. Metallization lines 535 therefore have a width approximately equal to spacing S1 less twice the thickness T3 of dielectric liner material 345. Metallization line sidewall 236 has nearly a zero lateral offset from metallization line sidewall 536. Metallization lines 235 and 535 thus may have nearly a 100% fill factor. While such minimal spacing between adjacent metallization lines might otherwise suffer unacceptably high parasitic capacitance, the vertical separation (e.g., z-dimension) between metallization lines 235 and 535 will significantly reduce adjacent line parasitics. Hence, vertical separation of the intra-level (M2A-M2B) metallization lines can reduce electrical resistance and increase line density by increasing the line fill factor, as well as control intra-level parasitic capacitance.

Figure 14A:
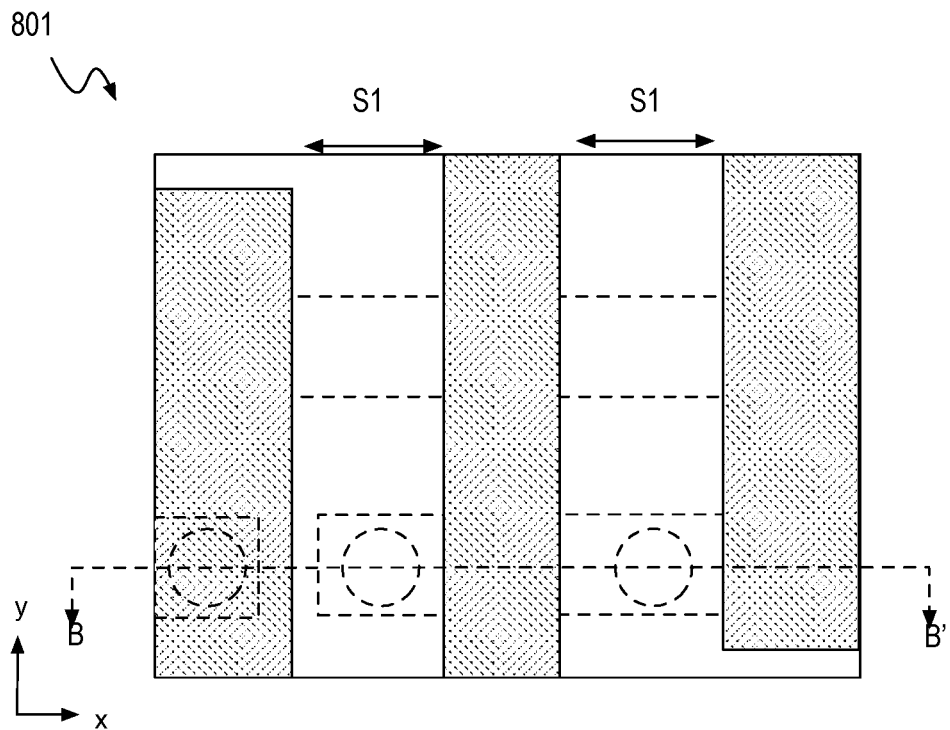
Figure 14B:
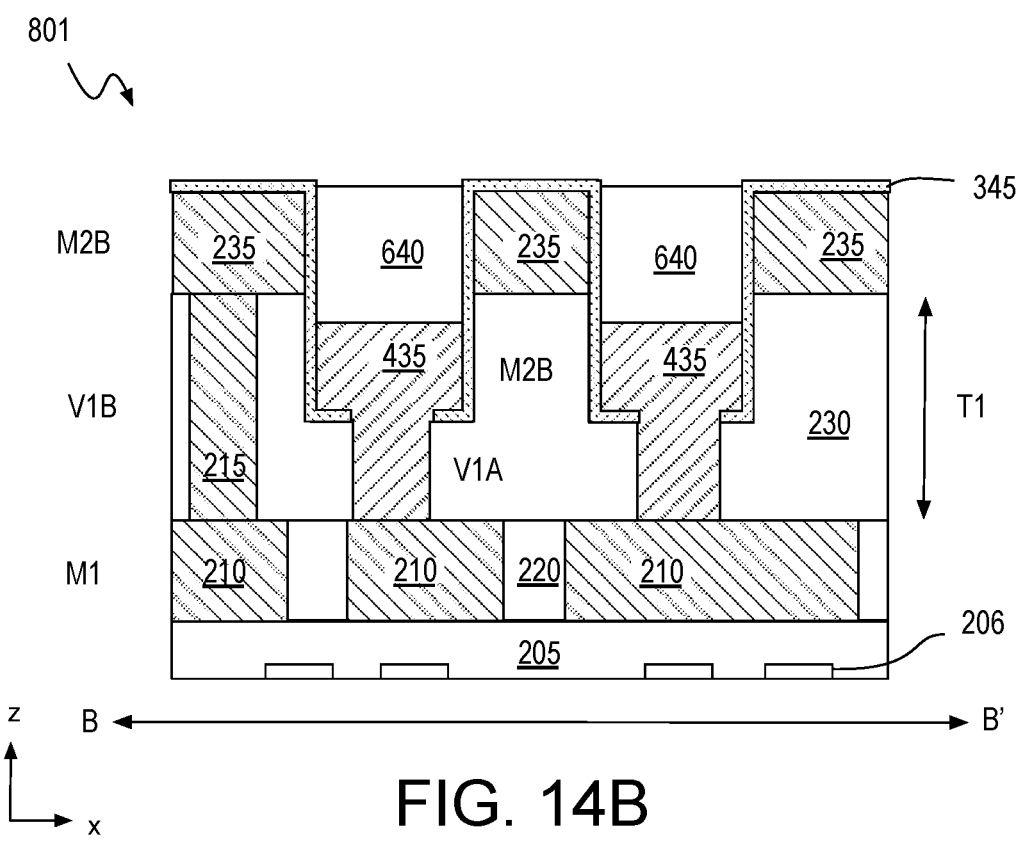

With the intra-level lines fabricated, methods 701 continue through blocks 150 and 160 where the remaining non-planarity between the intra-level metallization lines is eliminated by backfilling a dielectric material and planarizing that dielectric material with a top surface of the upper metallization lines. The processes performed at blocks 150 and 160 may be substantially as described above, for example, to arrive at the interconnect structure 801 as illustrated in FIGS. 14A and 14B. Dielectric liner material 345 may remain over metallization lines 235 (e.g., as a polish stop layer), as shown, or it may be removed during the planarization process so that a top surface of metallization lines 235 are exposed. At this point, interconnect structure 801 shares many of the structural attributes of interconnect structure 201 (e.g., FIG. 6A-6B). Methods 701 (FIG. 7) may therefore be completed at output 170 in substantially the same manner described above. For example, upper interconnect level vias may be made to various ones of the intra-level metallization lines, as needed, and any additional levels of metallization may be fabricated to complete the integrated circuitry.

Figure 15:
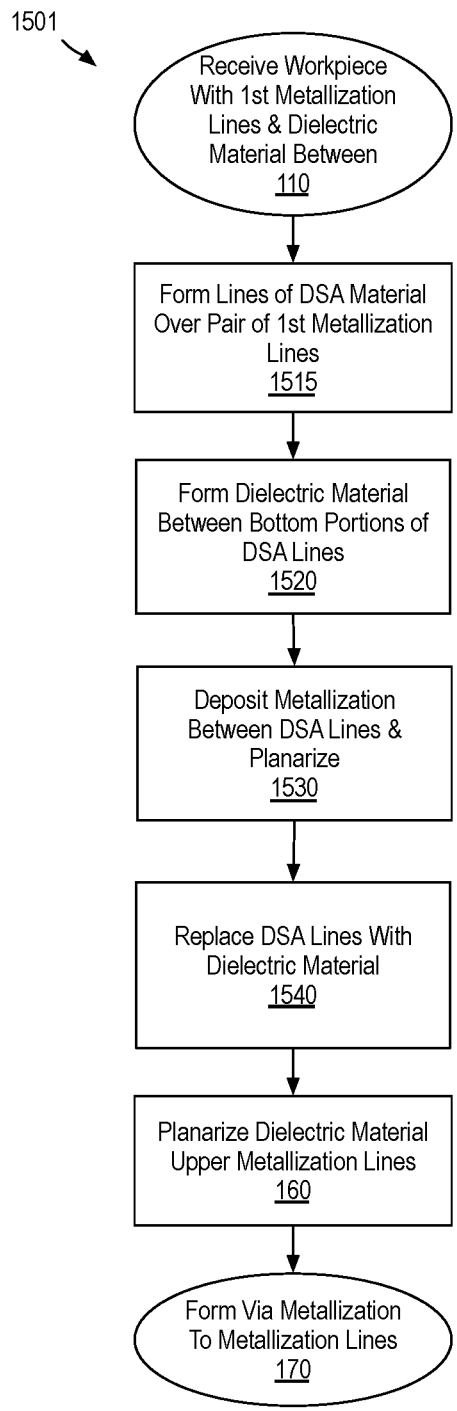
FIG. 15 is a flow chart of methods of vertically spacing intra-level metallization lines, in accordance with some alternative embodiments.

While methods 101 and 701 illustrated exemplary "top-down" approaches to fabricating self-aligned intra-level metallization lines, "bottom-up" approaches may also be practiced. FIG. 15 is a flow chart of methods 1501 for vertically spacing intra-level metallization lines, in accordance with some "bottom-up" embodiments. FIG. 16A-19A illustrate a plan view of a portion of an interconnect structure 1601 evolving as methods 1501 are practiced, in accordance with some embodiments. FIG. 16B-19B illustrate a cross-sectional view of interconnect structure 1601 along the B-B' line depicted in FIG. 16A-19A, respectively. For FIG. 15-19, a feature retaining the reference label of a feature introduced above in the context of FIG. 1-14 may have any of the attributes previously described for that feature.

Referring first to FIG. 15, methods again begin at input 110 where a workpiece having a metallization lines and dielectric material between the metallization lines is received. The workpiece may include one or more underlying device layers including the semiconductor material layer, and may also have one or more interconnect levels interconnecting the devices (e.g. transistors). As received, the work surface of the workpiece is advantageously planar and comprises a thickness of dielectric material over any number of underlying device or interconnect metallization levels. Metallization lines over, or embedded within, this dielectric material are in this embodiment to become lower intra-level metallization lines.

Figure 16A:
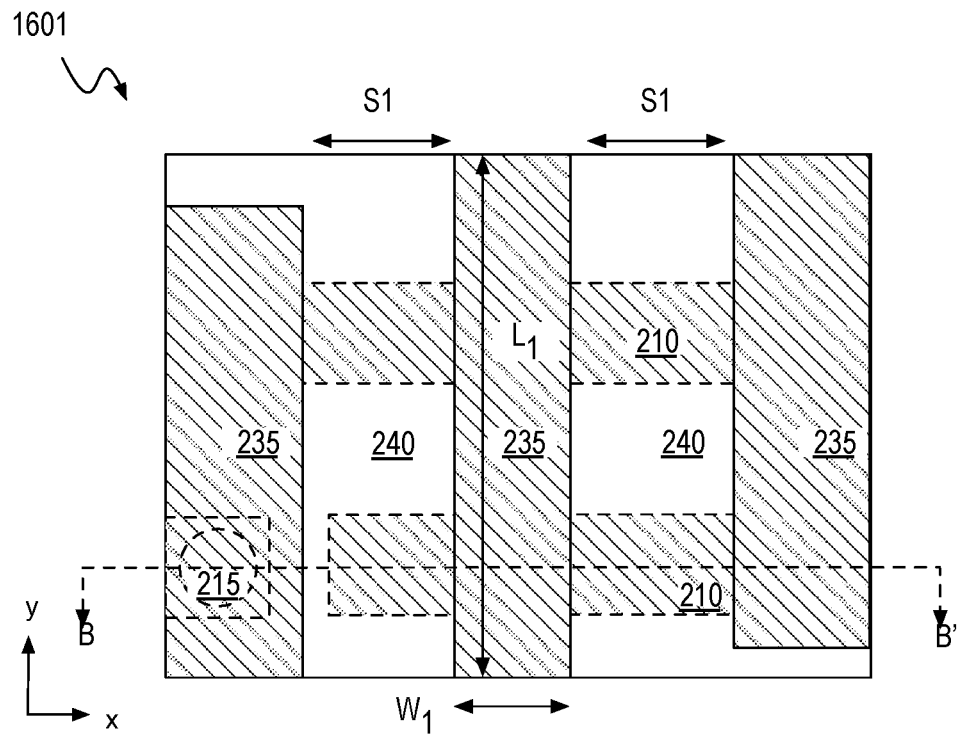
FIGS. 16A, 17A, 18A, and 19A illustrate a plan view of a portion of an interconnect structure evolving as the methods illustrated in FIG. 15 are practiced, in accordance with some embodiments.
Figure 16B:
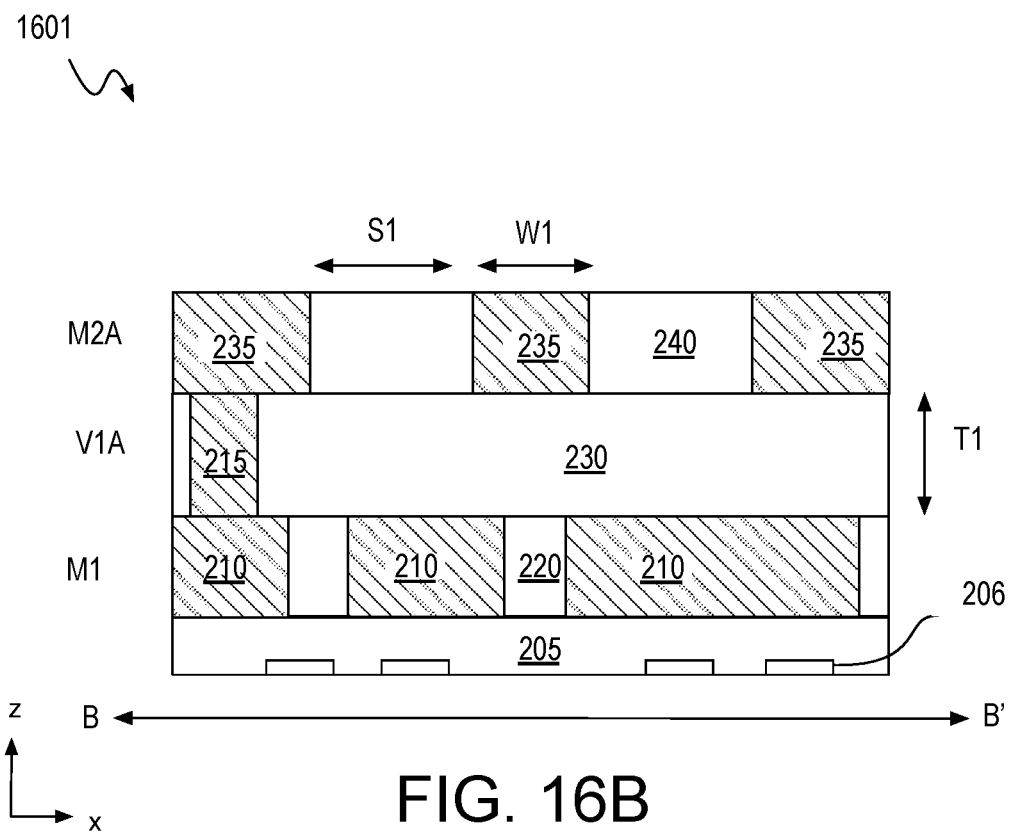
FIGS. 16B, 17B, 18B and 19B illustrate a cross-sectional view of a portion of an interconnect structure evolving as the methods illustrated in FIG. 15 are practiced, in accordance with some embodiments.

In the example further illustrated in FIGS. 16A and 16B, an interconnect structure 1601, when received as a starting material, has many of the same structures of interconnect structures 201 and/or 801. In the example shown in FIGS. 16A and 16B, metallization lines 235 again have a line length L1 that is significantly larger than line width W1. There is a spacing S1 between adjacent metallization lines 235. Via metallization 215 interconnects one of the metallization lines 235 to metallization line 210 of an underlying metallization level M1. In this example, dielectric material 230 has a thickness T1 that may be less than for interconnect structures 201 or 801 because metallization lines 235 are to become lower metallization lines of a self-aligned intra-level metallization lines.

Returning to FIG. 15, methods 1501 continue at block 1515 where dielectric material is selectively formed over the metallization lines present in the starting material. Selective dielectric material formation may proceed in a number of manners. As one example, directed self-assembly (DSA) is employed as a means of distinguishing between surfaces of the metallization lines and the adjacent dielectric material. Any of the DSA techniques known to be suitable for forming a self-assembled monolayer (SAM), or the like may be practiced at block 1515. For example, a diblock copolymer (DCP) may be deposited over a surface of the workpiece with a phase separation in the DCP occurring in a manner sensitive to different surface polarity of the heterogeneous (e.g., hydrophilic/hydrophobic, etc.) workpiece surface. Methods 1501 then continue at block 1520 where a dielectric material is formed between lines of DSA/SAM material. This dielectric material may be deposited selectively over dielectric material relative to the DSA/SAM material, or may be deposited unselectively and then planarized/etched back to expose the DSA/SAM material. In advantageous embodiments the thickness of the dielectric material deposited at block 1520 is less than the height/thickness of the DSA/SAM material. If needed, the dielectric material deposited between the lines of DSA/SAM material may be recessed after deposition, for example with etch process that is selective to the dielectric material over the DSA/SAM material.

Figure 17A:
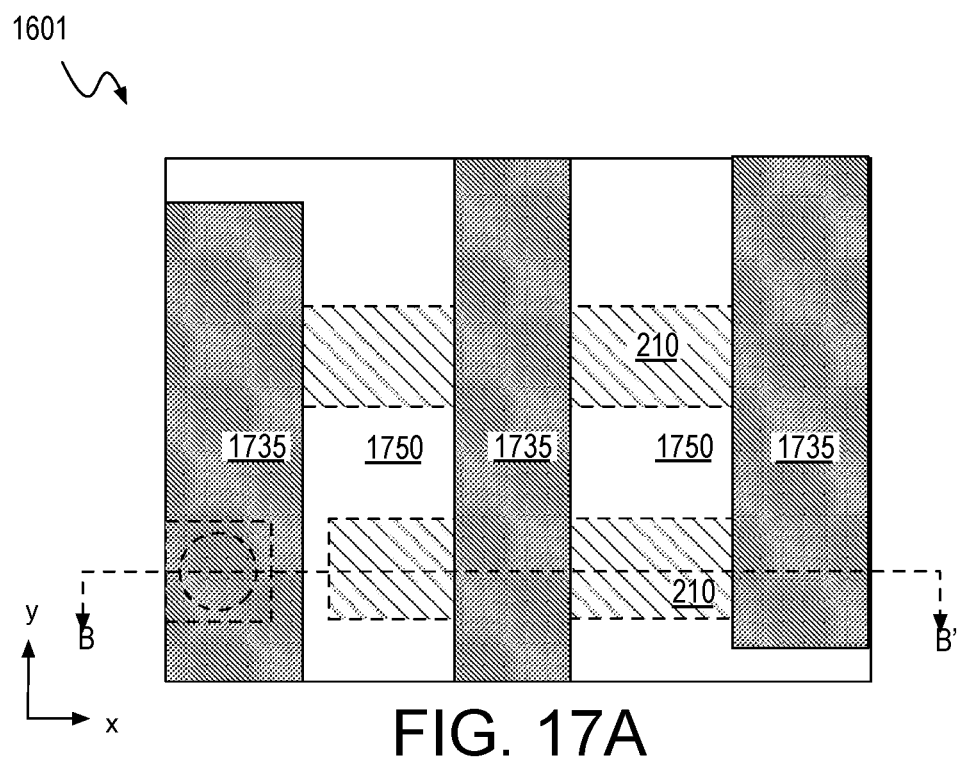
Figure 17B:
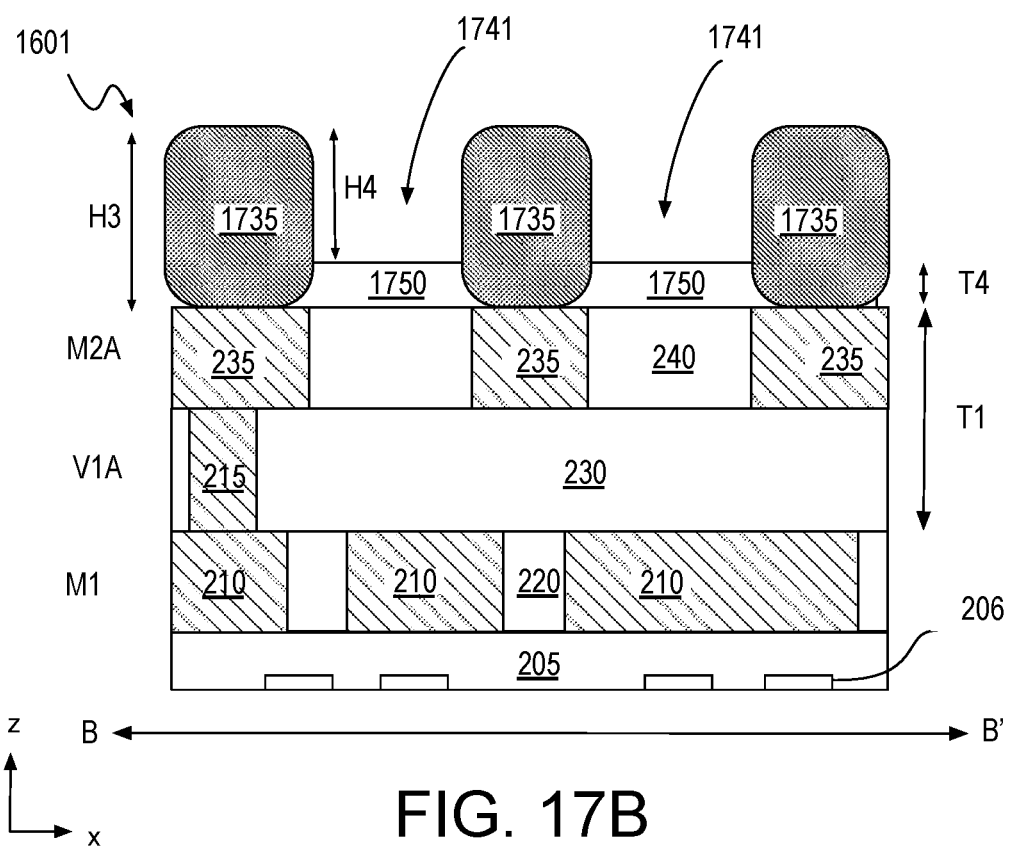

In the example illustrated in FIGS. 17A and 17B, a DSA/SAM material 1735 remains over metallization 235, for example following dissolution of the phase of a DCP that formed over dielectric material 240. Dielectric material 1750 has been deposited between DSA/SAM material 1735, and on to dielectric material 240. Dielectric material 1750 may have any composition, such as any of those described elsewhere herein for dielectric materials 220, 230, or 240. Following deposition, and potentially a planarization and etchback, dielectric material 1750 has a thickness T4 that is significantly less than a height H3 of DSA/SAM material 1735. Trenches 1741 between DSA/SAM material 1735 are therefore self-aligned to spaces S1 between metallization lines 235. Trenches 1741 are vertically separated from metallization lines 235 by the thickness of dielectric material 1750.

Returning to FIG. 15, methods 1501 continue at block 1530 where metallization is deposited within the trenches defined by the lines of DSA/SAM material. The metallization may then be planarized to expose DSA/SAM material and delineate the second (upper) metallization lines of the interconnect level. If the DSA/SAM material is sacrificial, it is removed and replaced with any suitable dielectric material at block 1540. At block 160, that dielectric material may be further planarized with the metallization lines that were formed at block 1530. Alternatively, where the DSA/SAM material is a suitable dielectric material to permanently retain within the interconnect structure, blocks 1540 and 160 may be skipped. Methods 1501 may then be completed at the output 170, for example with the formation of vias of the next interconnect level contacting various ones of the metallization lines fabricated thus far.

Figure 18A:
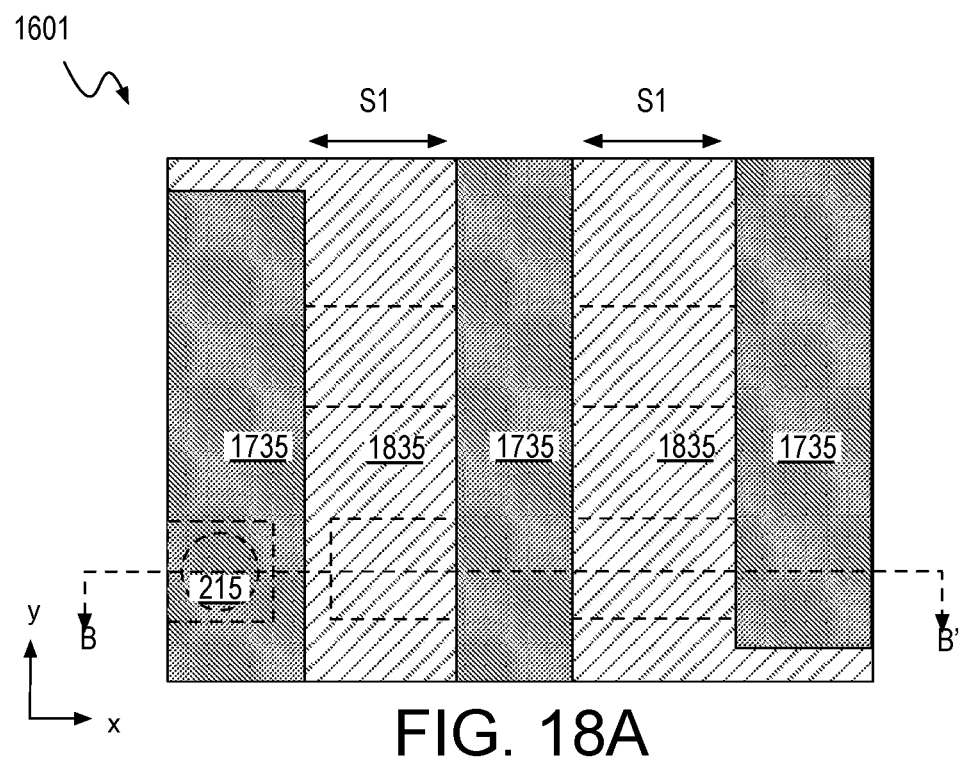
Figure 18B:
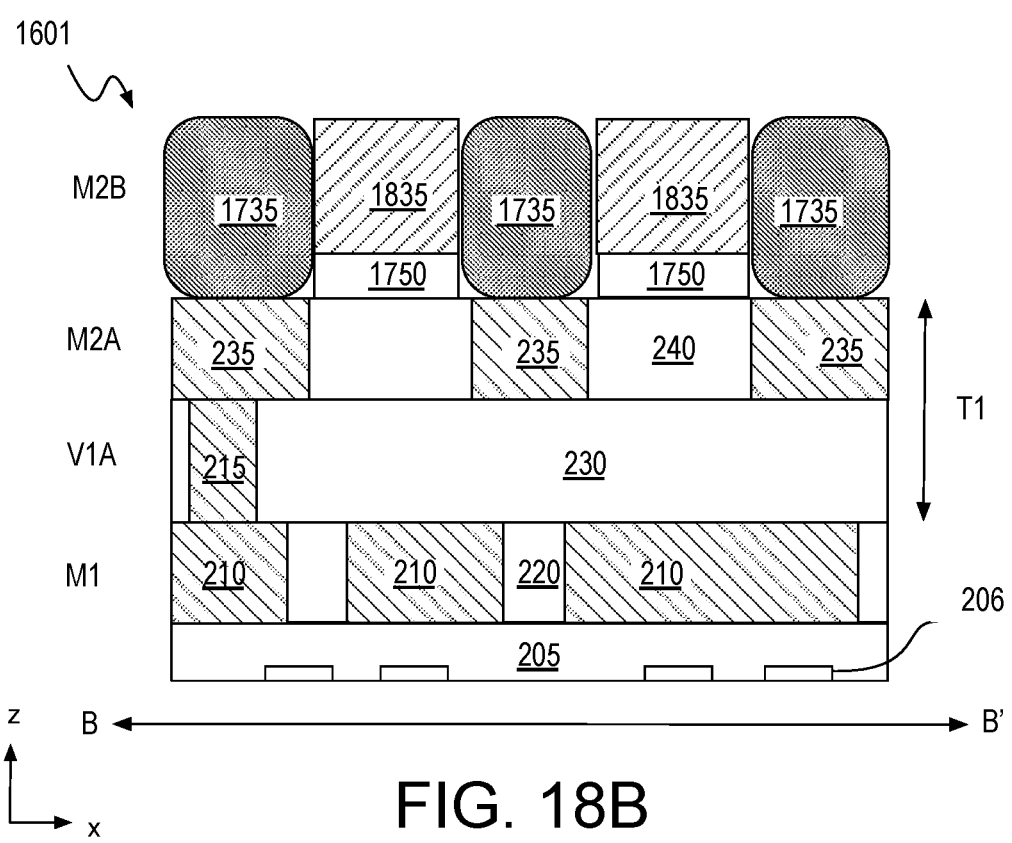

In the example illustrated in FIGS. 18A and 18B, a metallization has been planarized into metallization lines 1835 that occupy trenches between DSA/SAM material 1735. Metallization lines 235 and metallization lines 1835 may each comprise any metal(s) suitable for integrated circuitry. Metallization lines 1835 may have the same composition as metallization lines 235, or may have a different composition. Because CMP may be relied upon to fully pattern both metallization lines 235 and metallization lines 1835, the both may comprise predominantly Cu, if desired. Alternatively, other metals more amenable to chemical etch may be employed for either, or both, of metallization lines 235 and 1835. For example, either, or both of metallization lines 235 and 1835 may comprise any of Cu, Ru, W, Mo, Co, or Al.

Figure 19A:
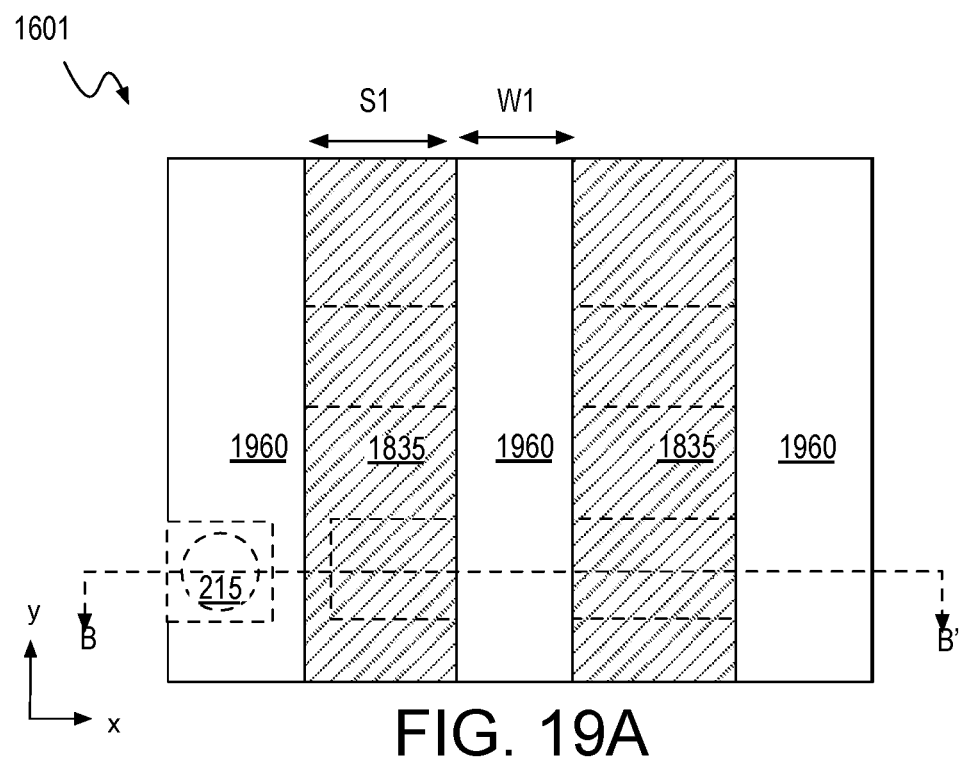
Figure 19B:
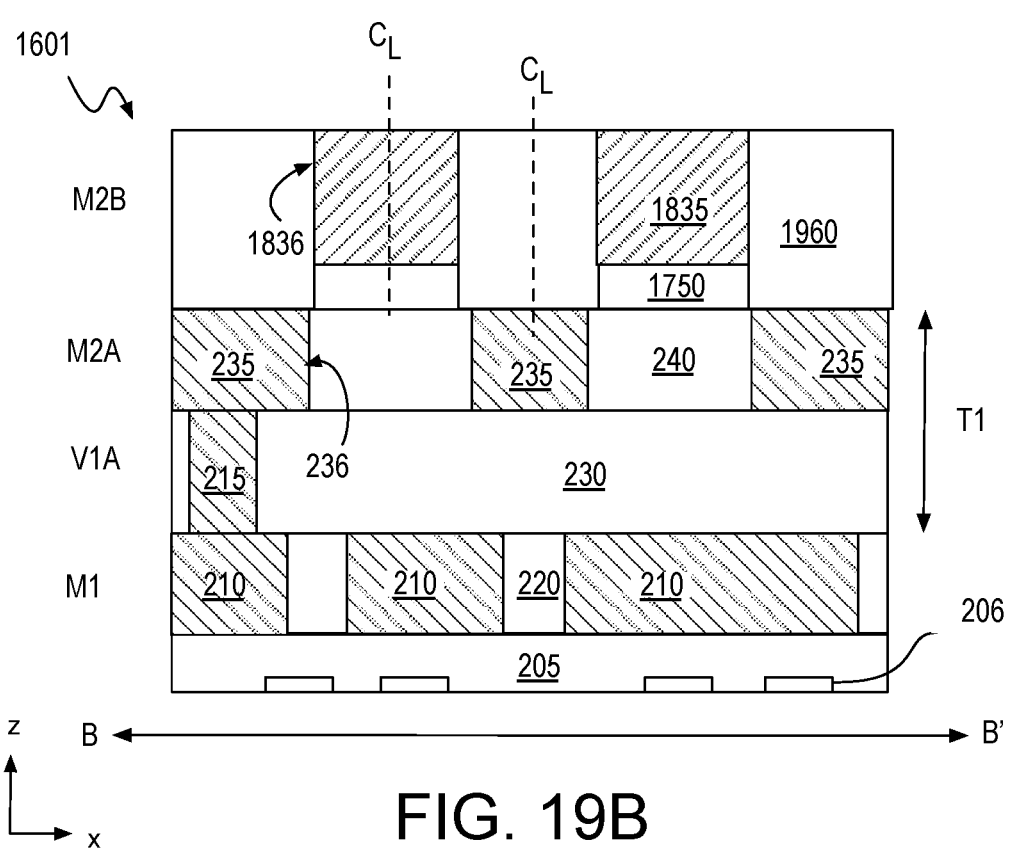

In the example further illustrated in FIGS. 19A and 19B, DSA/SAM material 1735 has been replaced with a dielectric material 1960, which may, for example, have any of the compositions described elsewhere herein for dielectric materials 220, 230, 240, or 1750. Interconnect structure 1601 is now ready for the further fabrication of any additional interconnect levels desired. As shown, dielectric material 1960 that has a top surface substantially co-planar with a top of metallization lines 1835. Metallization lines 1835 are above dielectric material 1750, and are therefore in a upper plane (M2B) of interconnect level M2. Metallization lines 235, being under metallization lines 1835, are therefore in a lower plane (M2A) of interconnect level M2. Because metallization lines 1835 are formed through deposition(s) self-aligned to metallization lines 235, a centerline $C_L$ of width W1 of each metallization line 235 is coincident with the centerline $C_L$, of the space between adjacent metallization lines 1835. Likewise, a centerline of $C_L$ of each metallization line 1835 is coincident with the centerline $C_L$ of the space S1 between adjacent metallization lines 235. This will be true even if there are differences in pitch between metallization lines 235 and 1835, for example as a result of a dimensional bias in the formation of metallization lines 1835. As shown in FIG. 19B, there is substantially no lateral separation between metallization lines 235 and 1835 with metallization lines 1835 having a width substantially equal to spacing S1 between metallization lines 235. In other words, metallization line sidewall 236 has zero lateral offset from metallization lines sidewall 1836. The fill factor of metallization lines 235 and 1835 is therefore also substantially 100% within interconnect structure 1601. While such high line fill factor might result in electrical shorts or otherwise induce unacceptably high parasitic capacitance, the vertical separation (e.g., z-dimension) between metallization lines 235 and 1835 ensures electrical isolation and reduces adjacent line parasitics. Hence, vertical separation of the intra-level (M2A-M2B) metallization lines can reduce electrical resistance and increase line density by increasing the line fill factor, as well as reduce intra-level parasitic capacitance.

The various exemplary methods of vertically spacing intra-level metallization lines, and there resulting structures may be further interconnected through a via metallization process that ensures at least the deeper vias which pass through a plane of the upper metallization lines have a smaller diameter than the lower metallization line widths. Shallower vias to the upper metallization level and deeper vias to the lower metallization level may be formed according to any known techniques of etching via openings and fill those openings with metallization. Single or double via patterning techniques may be employed, as embodiments herein are not limited in this respect.

Figure 20:
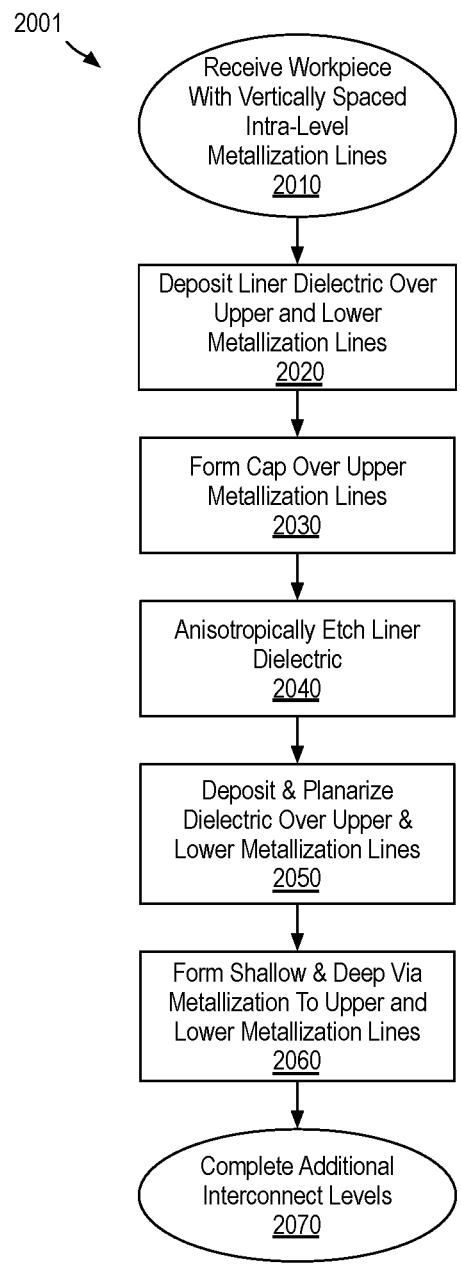
FIG. 20 is a flow chart of methods of forming via metallization to vertically spaced intra-level metallization lines, in accordance with some alternative embodiments.

FIG. 20 is a flow chart of methods 2001 for fabricating vias to intra-level metallization lines that are vertically spaced, in accordance with some alternative embodiments. Methods 2001 are an example of a spacer-based process that leverages non-planarity between the intra-level metallization lines to at least partially self-align via metallization to the lower metallization lines. FIG. 21A-25A illustrate a plan view of a portion of an interconnect structure 2101 evolving as methods 2001 are practiced, in accordance with some embodiments. FIG. 21B-25B illustrate a cross-sectional view of interconnect structure 2101 along the B-B' line depicted in FIG. 21A-25A, respectively. For FIG. 20-25, a feature retaining the reference label of a feature introduced above in the context of FIG. 1-19 may have any of the attributes previously described for that feature.

Referring first to FIG. 20, methods 2001 begin at block 2010 where a workpiece is received with upper and lower metallization lines within an IC interconnect level. In exemplary embodiments, the workpiece received at block 2010 is any of interconnect structures 201, 801 or 1601 following the practice of methods 201, 701 or 1501, respectively. In some examples, methods 2001 are performed prior to block 160 in methods 201, 701 or 1501 at which point the upper level of metallization lines not yet planarized with a dielectric material.

Methods 2001 continue at block 2020 where a dielectric liner material is deposited between the upper metallization lines and over the lower metallization lines. A topography dependent process is then employed at block 2030 to further form a cap or helmet structure over the portion of the dielectric liner material that is on the upper metallization lines. This helmet structure is then employed as an etch mask during an anisotropic "spacer" etch of the dielectric liner material at block 2040. Spacers of the dielectric liner material adjacent to the upper metallization lines then facilitate the formation of a partially self-aligned narrow via between the upper metallization lines.

Figure 21A:
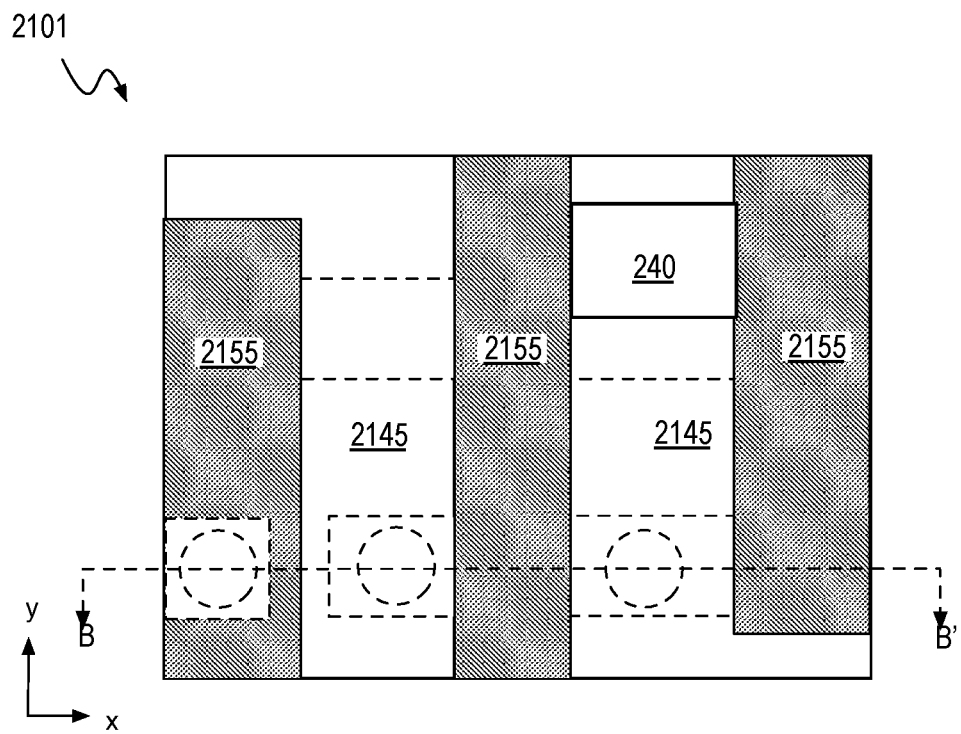
FIGS. 21A, 22A, 23A, 24A, and 25A illustrate a plan view of a portion of an interconnect structure evolving as the methods illustrated in FIG. 20 are practiced, in accordance with some embodiments.
Figure 21B:
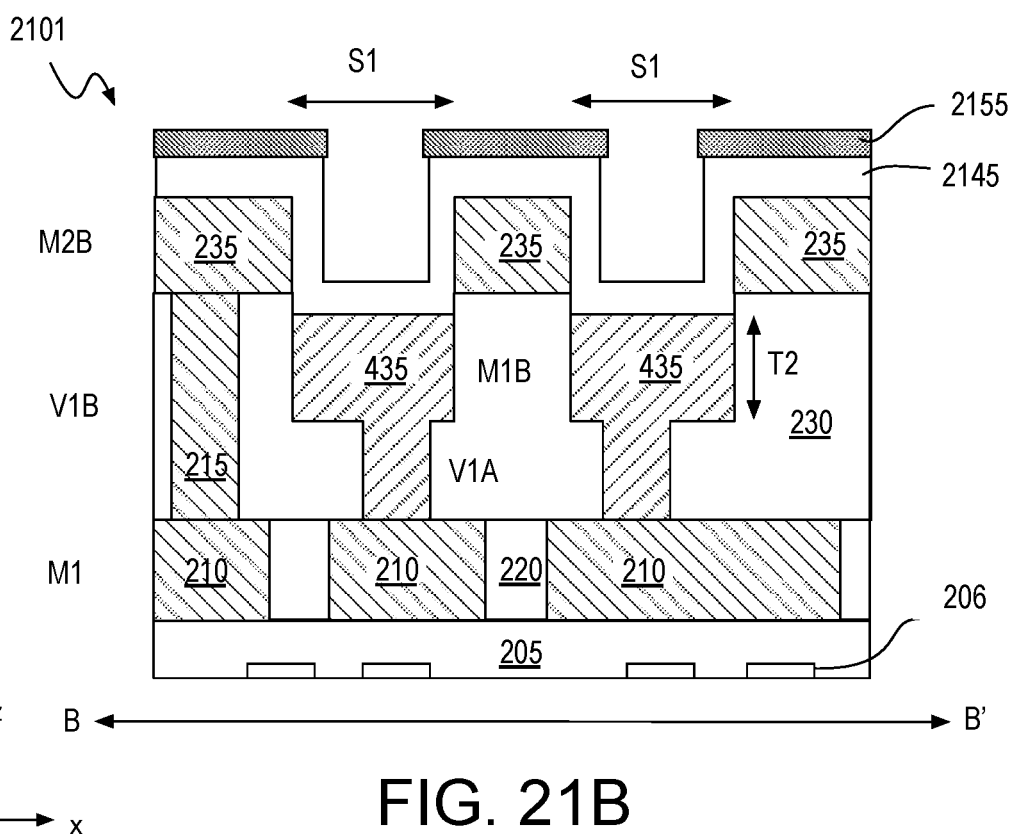
FIGS. 21B, 22B, 23B, 24B, and 25B illustrate a cross-sectional view of a portion of an interconnect structure evolving as the methods illustrated in FIG. 20 are practiced, in accordance with some embodiments.
Figure 22A:
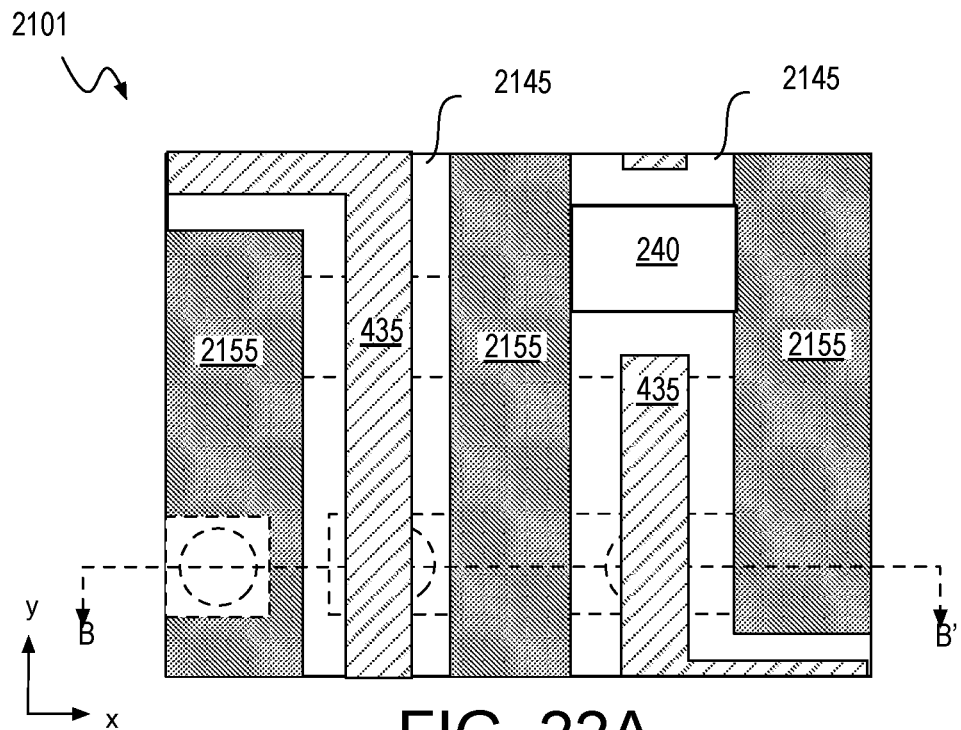
Figure 22B:
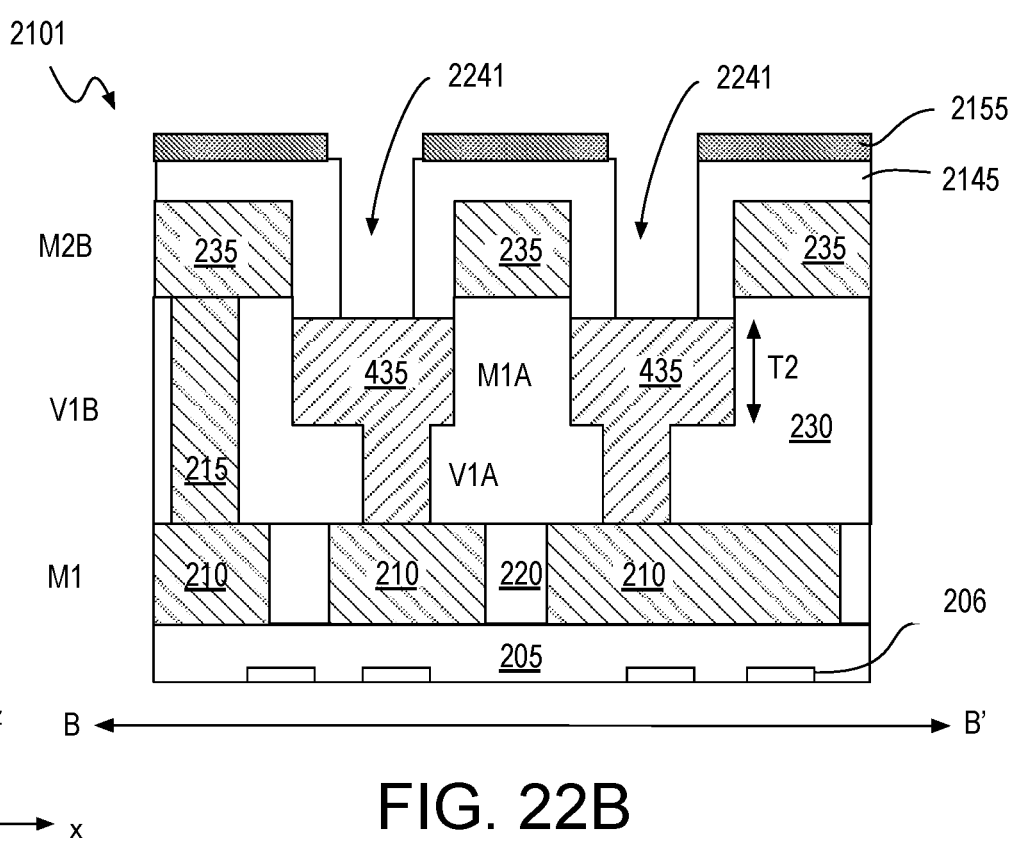

In the example illustrated in FIGS. 21A and 21B, interconnect structure 2101 includes interconnect structure 201 following the deposition of dielectric liner material 2145 over metallization lines 235 and 435. Dielectric liner material 2145 may be any suitable dielectric material (e.g., such as any of those described for dielectric materials 220 or 230, etc.). As shown, a substantially conformal deposition process has been employed to deposit dielectric liner material 2145 to a thickness less than half of the spacing S1. As further illustrated, a cap/helmet structure 2155 is in contact with liner material 2145 in regions over metallization lines 235. Helmet structure 2155 can be selectively formed according to a number of techniques known in the art, for example through catalytic deposition processes and/or non-conformal deposition processes. The interested reader is referred to U.S. Pat. No. 10,541,143 (commonly assigned) for a further description of techniques suitable for forming helmet structure 2155. As further illustrated in FIGS. 22A and 22B, liner material 2145 has been anisotropically etched to form trenches 2241, which expose a top of metallization lines 435 without exposing a sidewall of metallization lines 235.

Returning to FIG. 20, methods 2001 continue at block 2050 where a dielectric material having a composition distinct from that of the dielectric liner material is deposited into the trenches formed at block 2040, and planarized to some thickness suitable for an inter-level dielectric (ILD). Deep and shallow via openings are then patterned and etched in the dielectric material at block 2060 with the deep via openings being restricted to a small diameter as a result of selectivity of the via etch. Via metallization may then be deposited into the deep and shallow vias. Methods 2001 are then completed at output 2070 following the completion of one or more additional levels of interconnect line metallization.

Figure 23A:
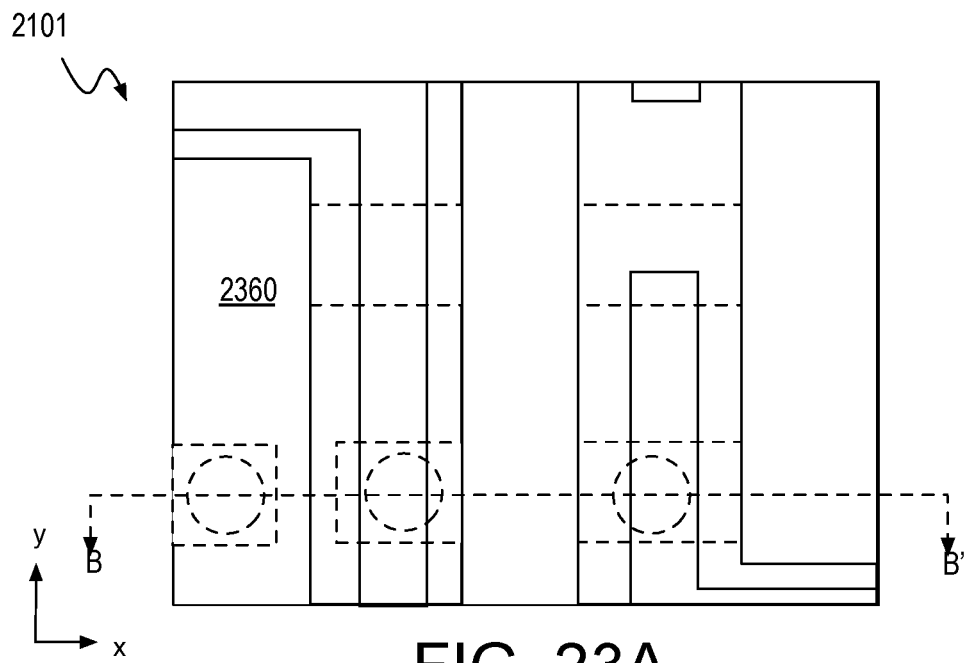
Figure 23B:
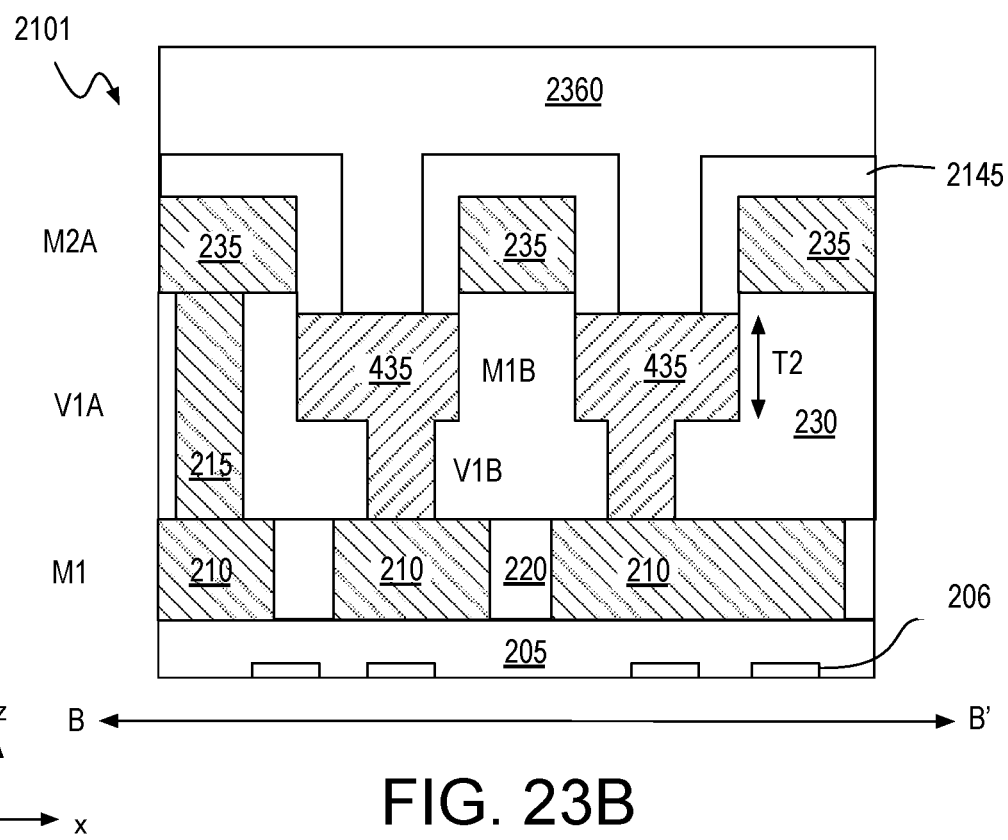

In the example illustrated in FIGS. 23A and 23B, a dielectric material 2360 has been planarized over metallization lines 235. Although helmet structure 2155 has been removed in this example, it may also be retained as a permanent feature of interconnect structure 2101.

Figure 24A:
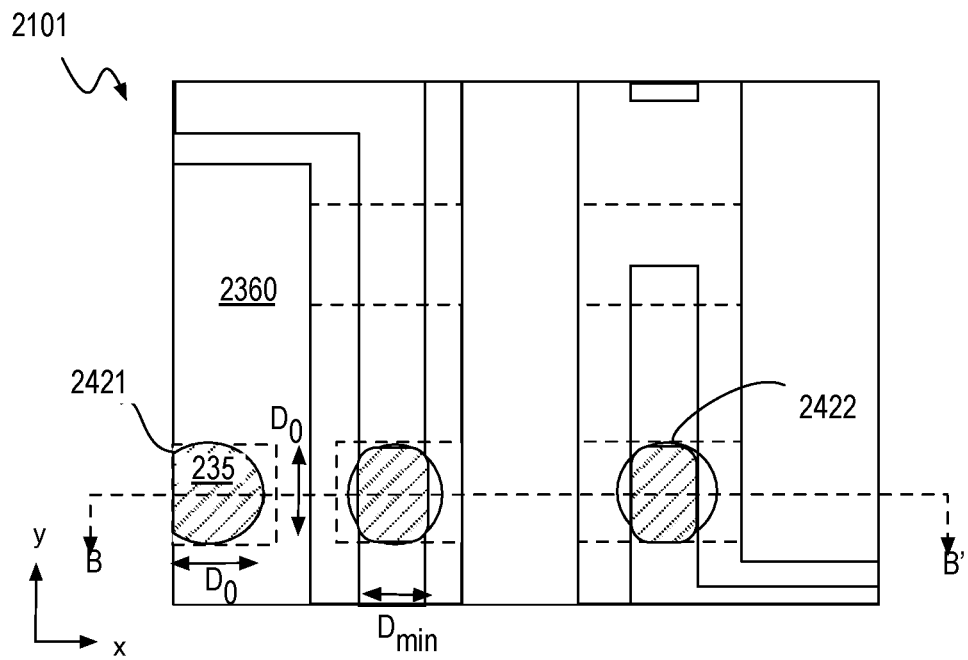
Figure 24B:
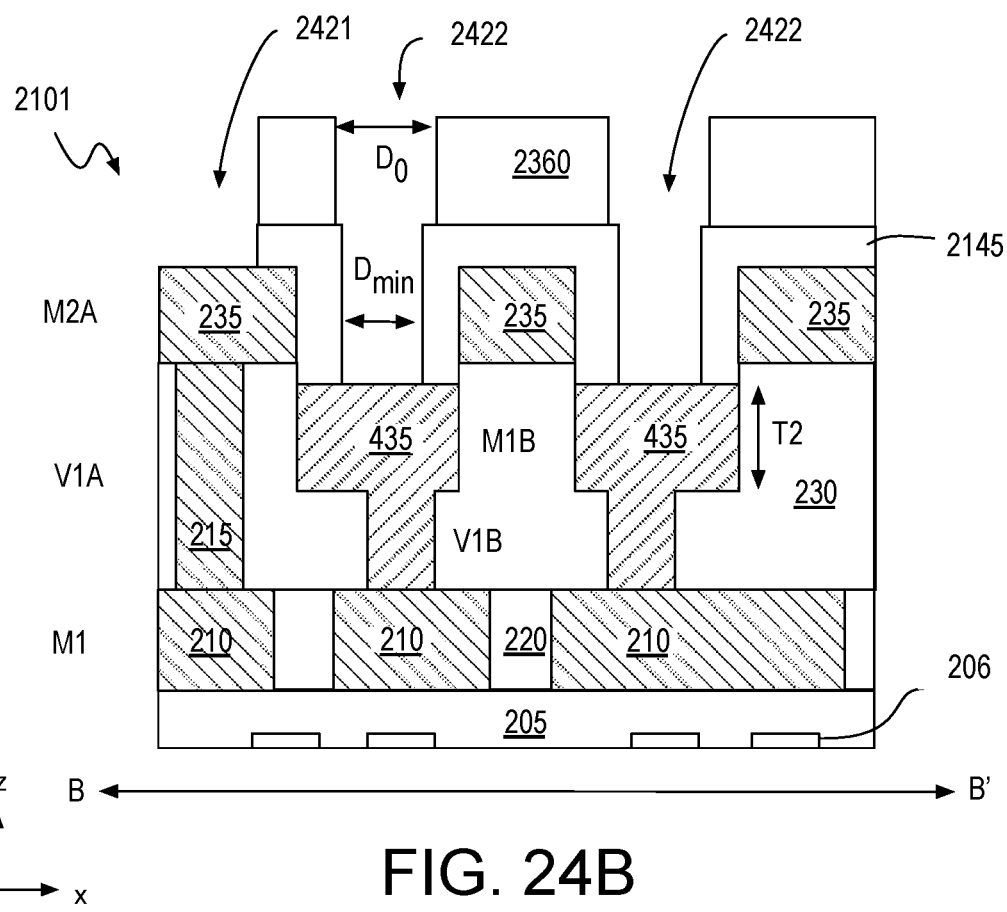

As further illustrated in FIGS. 24A and 24B, shallow via opening 2421 and deep via opening 2422 have been concurrently etched through dielectric material 2360. As illustrated, both via openings 2421 and 2422 have the maximum diameter D0 in a dimension parallel to a length of metallization lines 235 (e.g., y-dimension). However, within a dimension perpendicular to line length L1 (e.g., x-dimension), dielectric liner material 2145 self-aligns via opening 2422 down to a minimum diameter of Dmin, which is smaller than maximum diameter D0.

Figure 25A:
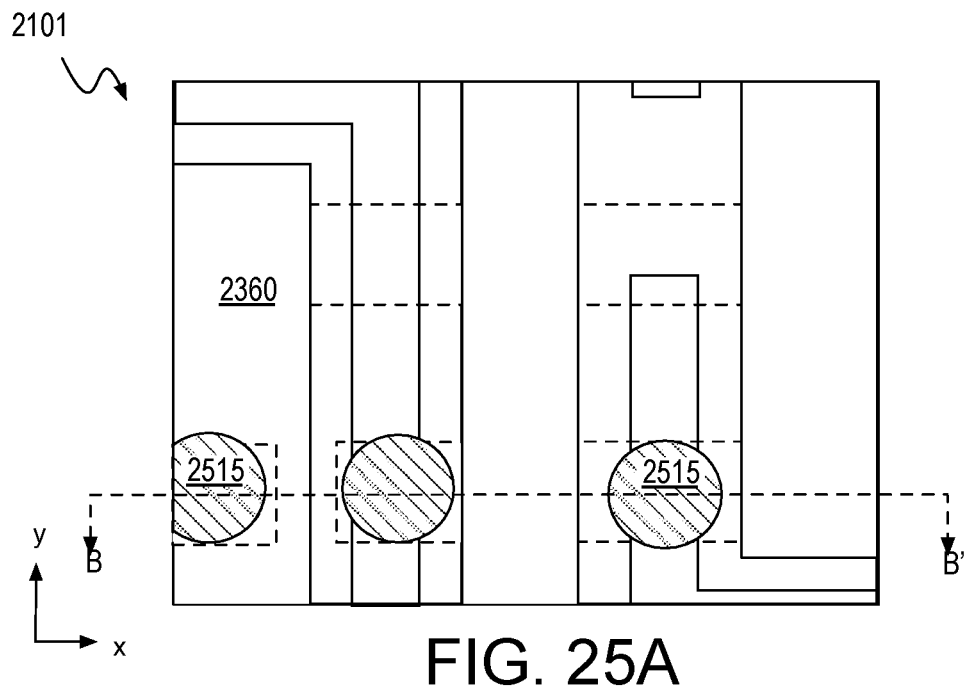
Figure 25B:
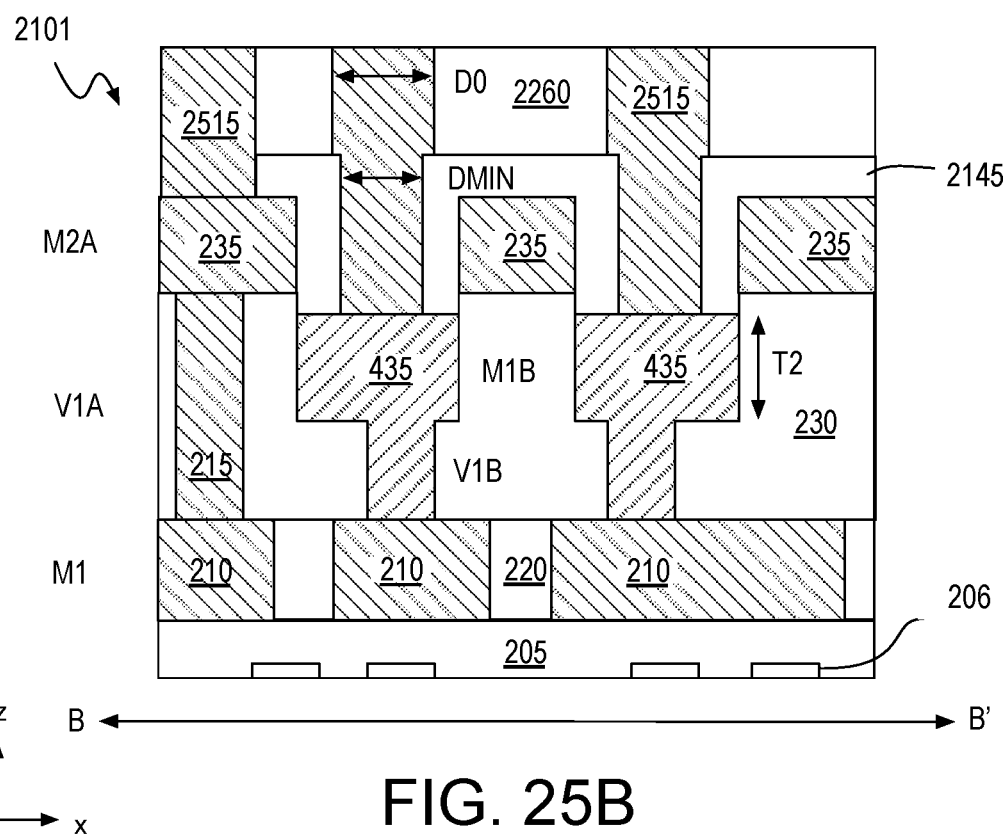

In the example shown in FIGS. 25A and 25B, via metallization 2515 has been deposited into shallow and deep vias, and planarized with dielectric material 2260. Interconnect structure 2101 is then ready for a next level of line metallization. Although methods 2001 have been described and illustrated in the context of forming narrow vias to lower metallization lines of one interconnect level, substantially the same technique may be applied to form narrow vias from upper metallization lines of an interconnect level to an underlying interconnect level. For example, methods 2001 may be performed as part of block 725 in methods 701 (FIG. 7).

Figure 26:
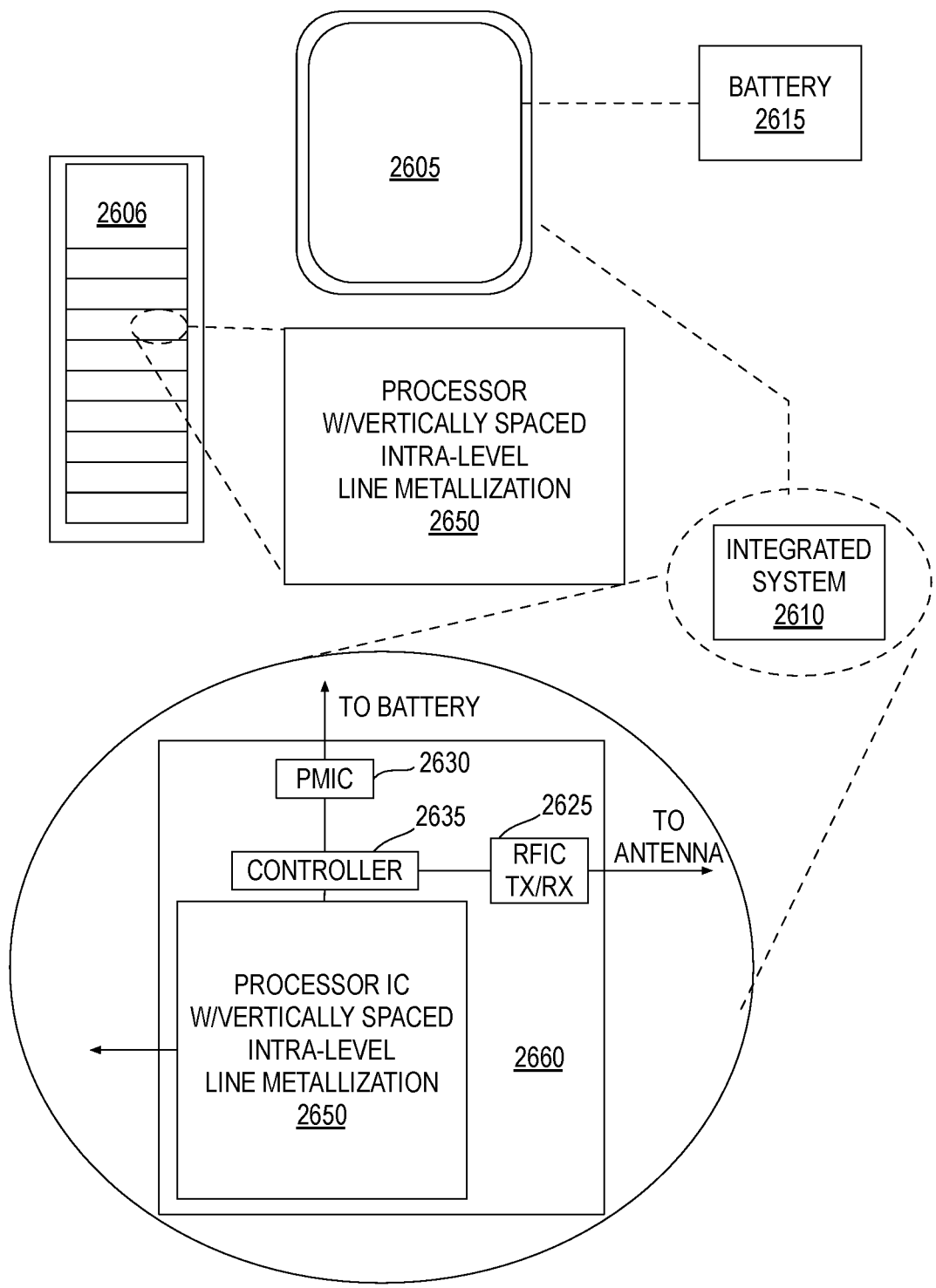
FIG. 26 is a functional block diagram of an electronic computing device, in accordance with some embodiments.

FIG. 26 illustrates a mobile computing platform 2605 and a data server machine 2606 employing an IC including interconnect structures with vertically spaced intra-level line metallization, for example as described elsewhere herein. The server machine 2606 may be any commercial server, for example including any number of high-performance computing platforms disposed within a rack and networked together for electronic data processing. In some exemplary embodiments server machine 2606 includes a microprocessor 2650 with vertically spaced intra-level line metallization, for example as described elsewhere herein. The mobile computing platform 2605 may be any portable device configured for each of electronic data display, electronic data processing, wireless electronic data transmission, or the like. For example, the mobile computing platform 2605 may be any of a tablet, a smart phone, laptop computer, etc., and may include a display screen (e.g., a capacitive, inductive, resistive, or optical touchscreen), a chip-level or package-level integrated system 2610, and a battery 2615.

At least one IC of chip-level or package-level integrated system 2610 includes vertically spaced intra-level line metallization, for example as described elsewhere herein. In the illustrated example, integrated system 2610 includes microprocessor 2650 having vertically spaced intra-level line metallization, for example as described elsewhere herein. Microprocessor 2650 may be further coupled to a board 2660, a substrate, or an interposer, one or more of a microcontroller 2635, a power management integrated circuit (PMIC) 2630, or an RF (wireless) integrated circuit (RFIC) 2625 including a wideband RF (wireless) transmitter and/or receiver (TX/RX).

Functionally, PMIC 2630 may perform battery power regulation, DC-to-DC conversion, etc., and has an input coupled to battery 2615 and with an output providing a current supply to other functional modules. As further illustrated, in the exemplary embodiment, RFIC 2625 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond.

Figure 27:
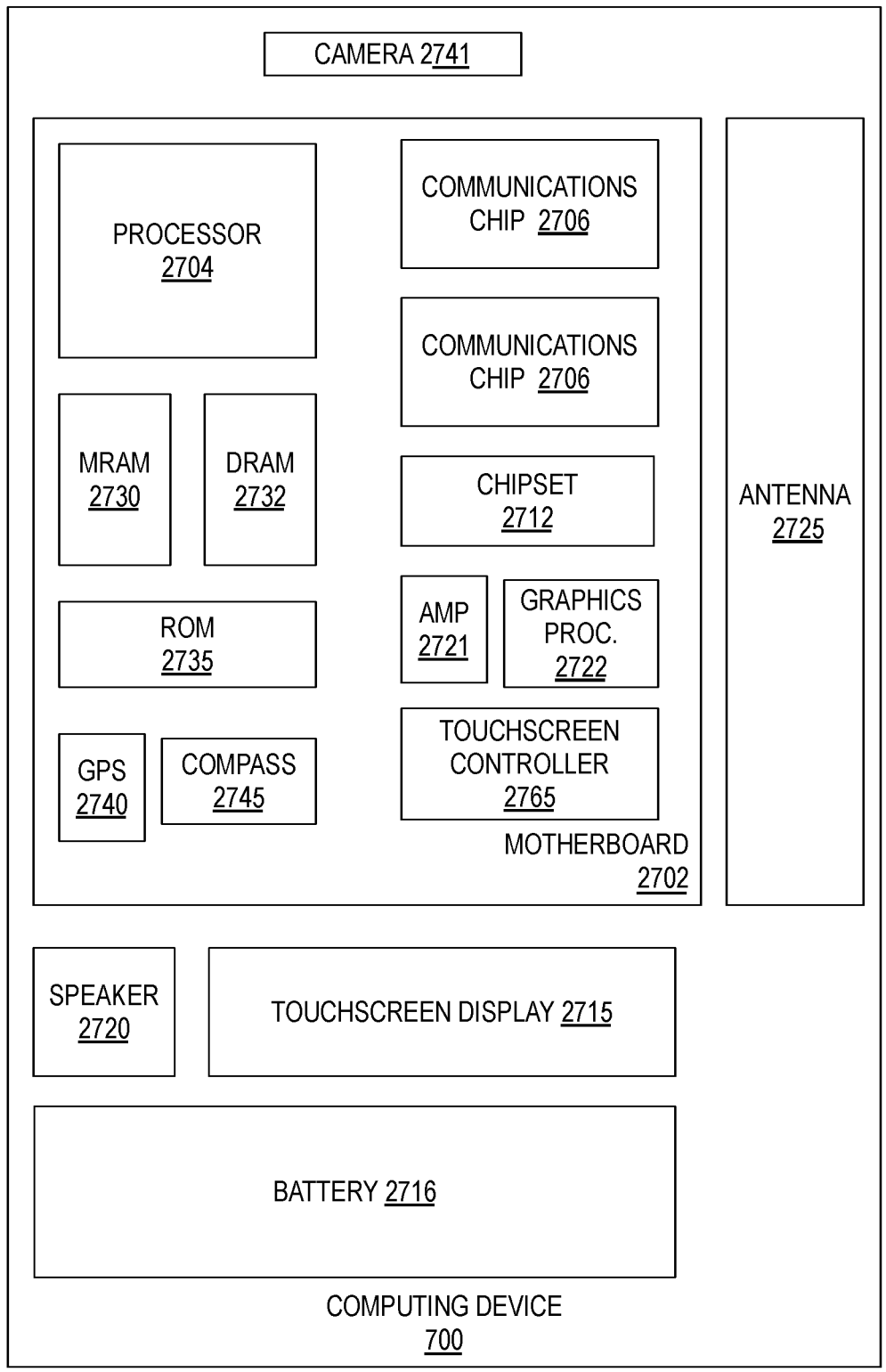
FIG. 27 illustrates a mobile computing platform and a data server computing platform employing an IC including an interconnect structure with vertically spaced intra-level metallization lines, in accordance with some embodiments.

FIG. 27 is a functional block diagram of an electronic computing device 2700, in accordance with an embodiment of the present invention. Computing device 2700 may be found inside platform 2605 or server machine 2606, for example. Device 2700 further includes a motherboard 2702 hosting a number of components, such as, but not limited to, a processor 2704 (e.g., an applications processor). Processor 2704 may be physically and/or electrically coupled to motherboard 2702. In some examples, processor 2704 includes self-aligned intra-level line metallization, for example as described elsewhere herein, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 2706 may also be physically and/or electrically coupled to the motherboard 2702. In further implementations, communication chips 2706 may be part of processor 2704. Depending on its applications, computing device 2700 may include other components that may or may not be physically and electrically coupled to motherboard 2702. These other components include, but are not limited to, volatile memory (e.g., DRAM 2732), non-volatile memory (e.g., ROM 2735), flash memory (e.g., NAND or NOR), magnetic memory (MRAM 2730), a graphics processor 2722, a digital signal processor, a crypto processor, a chipset 2712, an antenna 2725, touchscreen display 2715, touchscreen controller 2765, battery 2716, audio codec, video codec, power amplifier 2721, global positioning system (GPS) device 2740, compass 2745, accelerometer, gyroscope, speaker 2720, camera 2741, and mass storage device (such as hard disk drive, solid-state drive (SSD), compact disk (CD), digital versatile disk (DVD), and so forth), or the like.

Communication chips 2706 may enable wireless communications for the transfer of data to and from the computing device 2700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 2706 may implement any of a number of wireless standards or protocols, including but not limited to those described elsewhere herein. As discussed, computing device 2700 may include a plurality of communication chips 2706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

It will be recognized that the invention is not limited to the embodiments so described, but can be practiced with modification and alteration without departing from the scope of the appended claims. For example the above embodiments may include specific combinations of features as further provided below.

In first examples, an integrated circuit (IC) interconnect structure comprises a first interconnect level comprising a first metallization line co-planar with an adjacent second metallization line, a third metallization line out of a plane of the first and second metallization lines, the third metallization line having a centerline coincident with a centerline of a space between the first and second metallization lines. The IC interconnect structure further comprises a second interconnect level above or below the first interconnect level, the second interconnect level comprising one or more metallization lines interconnected to one or more of the first, second, or third metallization lines by via metallization.

In second examples, for any of the first examples the third metallization line has a width no smaller than the space between the first and second metallization lines.

In third examples, for any of the first through second examples a top surface of the third metallization line is below bottom surface of the first and second metallization lines.

In fourth examples, for any of the first through third examples the first and second metallization lines have a first metal composition, and the third metallization line has a second metal composition, different than the first.

In fifth examples, for any of the first through fourth examples the first metal composition comprises predominantly one of Cu, Ru, W, Mo, Co, or Al, and the second metal composition comprises predominantly one of Cu, Ru, W, Mo, Co, or Al.

In sixth examples, for any of the first through first examples the IC interconnect structure further comprises a liner dielectric material in contact with a sidewall of at least the third metallization, wherein the third metallization line has a width substantially equal to space between the first and second metallization lines minus twice a thickness of the liner dielectric material.

In seventh examples, for any of the sixth examples a top surface of the third metallization line is below bottom surface of the first and second metallization lines. The first, second, and third metallization lines all have substantially the same composition.

In eighth examples, for any of the first through seventh examples the via metallization comprises a first via metallization in contact the first line metallization, a second via metallization in contact with the third line metallization, and the first via metallization has a diameter smaller than the width of the first line metallization, or the second via metallization has a diameter smaller than a width of the third line metallization.

In ninth examples, for any of the eighth examples a top surface of the third metallization line is below the bottom surface of the first and second metallization lines, and the first via metallization has a minimum diameter, which is larger than the minimum diameter, perpendicular to a length of the first and second metallization lines, of the second via metallization. Alternatively, a top surface of the first metallization line and the second metallization line is below the bottom surface of the third metallization line, and the second via metallization has a minimum diameter, which is larger than the minimum diameter, perpendicular to a length of the first and second metallization lines, of the first via metallization.

In tenth examples, for any of the ninth examples the top surface of the third metallization line is below the bottom surface of the first and second metallization lines, and the first via metallization has a maximum diameter, which is substantially equal to the maximum diameter, parallel to a length of the first and second metallization lines, of the second via metallization. Alternatively, a top surface of the first metallization line and the second metallization line is below the bottom surface of the third metallization line, and the second via metallization has a maximum diameter, which is substantially equal to the maximum diameter, parallel to a length of the first and second metallization lines, of the first via metallization.

In eleventh examples, an integrated circuit (IC), comprises a device layer comprising a plurality of transistors comprising one or more semiconductor materials. The IC comprises a plurality of interconnect levels over the device layer. The interconnect levels further comprise a first interconnect level comprising a first metallization line co-planar with an adjacent second metallization line, a third metallization line out of a plane of the first and second metallization lines, the third metallization line having a centerline coincident with a centerline of a space between the first and second metallization lines. The interconnect levels further comprise a second interconnect level above or below the first interconnect level, the second interconnect level comprising one or more metallization lines interconnected to one or more of the first, second, or third metallization lines by via metallization.

In twelfth examples, for any of the eleventh examples the third metallization line has a width no smaller than the space between the first and second metallization lines.

In thirteenth examples, a computer platform comprises a power supply, and the IC of example eleven or twelve coupled to the power supply.

In fourteenth examples, a method of fabricating an interconnect structure comprises receiving a workpiece comprising a first metallization line co-planar with an adjacent second metallization line, with a first dielectric material in a space between the first and second metallization lines. The method comprises etching a trench into the first dielectric material as masked by the first and second metallization lines. The method comprises depositing metal into the trench. The method comprises forming a third line metallization between the first and second line metallizations by recessing a top surface of the metal to below a bottom of the first line metallization and a bottom of the second line metallization.

In fifteenth examples, for any of the fourteenth examples recessing the top surface of the metal further comprises etching the metal selectively to the first and second line metallizations.

In sixteenth examples, for any of the fourteenth through fifteenth examples the method further comprises depositing a dielectric liner material over a sidewall of the trench, and wherein recessing the top surface of the metal further comprises etching the metal selectively to the dielectric liner material.

In seventeenth examples, for any of the fourteenth through sixteenth examples the method further comprises depositing a second dielectric material over the first, second and third line metallizations. The method comprises forming a first via metallization through the second dielectric material to the first line metallization, and forming a second via metallization through the second dielectric material to the third line metallization.

In eighteenth examples, for any of the seventeenth examples the method further comprises forming a dielectric liner material adjacent to the first line metallization and adjacent to the second line metallization, and wherein forming the second via metallization further comprising etch through the second dielectric material selectively to the dielectric liner material.

In nineteenth examples, a method of fabricating an interconnect structure comprises receiving a workpiece comprising a first metallization line co-planar with an adjacent second metallization line, and a first dielectric material in a space between the first and second metallization lines. The method comprises forming a trench over the first dielectric material by selectively forming a second dielectric material over the first and second metallization lines. The method comprises depositing a third dielectric material over the first dielectric material and within a bottom of the trench. The method comprises depositing metal over the third dielectric material and within a top of the trench. The method comprises forming a third metallization line by planarizing the metal with the second dielectric material. The method comprises depositing a fourth dielectric material over the first, second and third metallization lines. The method comprises forming first via metallization to the first metallization line, and forming second via metallization to the third metallization line.

In twentieth examples, for any of the nineteenth examples selectively forming a second dielectric material over the first and second metallization lines further comprises a directed self assembly (DSA) of the second dielectric material.

In twenty-first examples, for any of the nineteenth through twentieth examples depositing the third dielectric material within the bottom of the trench further comprises substantially filling the trench, planarizing the third dielectric material with the second dielectric material and etching back the third dielectric material selectively over the second dielectric material.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

What is claimed is:

1. An integrated circuit (IC) interconnect structure, comprising:
   a first interconnect level comprising:
      a first metallization line adjacent to a second metallization line;
      a third metallization line between the first and second metallization lines and out of a plane of the first and second metallization lines; and
   via metallization coupling each of the first, second and third metallization lines to at least one of a second interconnect level below the first interconnect level or a third interconnect level above the first interconnect level.

2. The IC interconnect structure of claim 1, wherein a bottom surface of the first metallization line is coplanar with a bottom surface of the second metallization line.

3. The IC interconnect structure of claim 2, wherein a top surface of the third metallization line is below bottom surface of the first and second metallization lines.

4. The IC interconnect structure of claim 1, wherein the third metallization line has a centerline coincident with a centerline of a space between the first and second metallization lines.

5. The IC interconnect structure of claim 1, wherein:
   the first and second metallization lines have a first metal composition; and
   the third metallization line has a second metal composition, different than the first.

6. The IC interconnect structure of claim 5, wherein the first metal composition comprises predominantly one of Cu, Ru, W, Mo, Co, or Al, and the second metal composition comprises predominantly one of Cu, Ru, W, Mo, Co, or Al.

7. The IC interconnect structure of claim 1, wherein the via metallization couples the first and second metallization lines to the third interconnect level and couples the third metallization line to the second interconnect level.

8. The IC interconnect structure of claim 1, wherein the via metallization couples the first, second, and third metallization lines to the third interconnect level.

9. The IC interconnect structure of claim 1, wherein:
   the via metallization comprises:
      a first via metallization in contact with the first metallization line; and
      a second via metallization in contact with the third metallization line; and
   the first via metallization has a diameter smaller than the width of the first metallization line, or the second via metallization has a diameter smaller than a width of the third metallization line.

10. The IC interconnect structure of claim 9, wherein:
    the first via metallization has a minimum diameter larger than a minimum diameter of the second via metallization.

11. An apparatus, comprising:
    a plurality of transistors comprising one or more semiconductor materials; and
    a plurality of interconnect levels over the transistors, wherein the interconnect levels further comprise:
       a first interconnect level comprising:
          a first metallization line adjacent to a second metallization line;
          a third metallization line out of a plane of the first and second metallization lines; and
       a second interconnect level above or below the first interconnect level, the second interconnect level comprising one or more metallization lines interconnected to one or more of the first, second, or third metallization lines by via metallization.

12. The apparatus of claim 11, wherein the third metallization line has a centerline coincident with a centerline of a space between the first and second metallization lines.

13. The apparatus of claim 11, wherein a bottom surface of the first metallization line is co-planar with a bottom surface of the second metallization line.

14. The apparatus of claim 11, wherein a top surface of the third metallization line is below bottom surfaces of the first and second metallization lines.

15. The apparatus of claim 11, wherein:
    the first and second metallization lines have a first metal composition; and
    the third metallization line has a second metal composition, different than the first.

16. The apparatus of claim 15, wherein the first metal composition comprises predominantly one of Cu, Ru, W, Mo, Co, or Al, and the second metal composition comprises predominantly one of Cu, Ru, W, Mo, Co, or Al.

17. An apparatus comprising:
    a plurality of transistors; and
    an interconnect structure coupling the transistors into an integrated circuit, wherein the interconnect structure comprises:
       a first interconnect line level between second and third interconnect line levels, the first interconnect line level comprising a pair of first interconnect lines proximal to the second interconnect line level and a second interconnect line laterally between the pair of first interconnect lines and proximal to the third interconnect line level; and
       a plurality of vias interconnecting each of the first and second interconnect lines to interconnect lines in the second or third interconnect line levels.

18. The apparatus of claim 17, wherein the pair of first interconnect lines have a first metal composition, and the second interconnect line has a second metal composition, different than the first.

19. The apparatus of claim 18, wherein the first metal composition comprises predominantly one of Cu, Ru, W, Mo, Co, or Al, and the second metal composition comprises predominantly one of Cu, Ru, W, Mo, Co, or Al.

20. The apparatus of claim 17, wherein the second interconnect line has a centerline coincident with a centerline of a space between the pair of first interconnect lines.

* * * * *